United States Patent
Shim et al.

(10) Patent No.: US 10,790,294 B2
(45) Date of Patent: Sep. 29, 2020

(54) VERTICAL MEMORY DEVICE

(71) Applicants: Jae Joo Shim, Suwon-si (KR); Seong Soon Cho, Suwon-si (KR); Ji Hye Kim, Anyang-si (KR); Kyung Jun Shin, Seoul (KR)

(72) Inventors: Jae Joo Shim, Suwon-si (KR); Seong Soon Cho, Suwon-si (KR); Ji Hye Kim, Anyang-si (KR); Kyung Jun Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 179 days.

(21) Appl. No.: 15/465,355

(22) Filed: Mar. 21, 2017

(65) Prior Publication Data
US 2018/0122819 A1 May 3, 2018

(30) Foreign Application Priority Data
Nov. 3, 2016 (KR) .................. 10-2016-0145696

(51) Int. Cl.
*H01L 27/1157* (2017.01)
*H01L 27/11568* (2017.01)
(Continued)

(52) U.S. Cl.
CPC .... *H01L 27/11568* (2013.01); *H01L 27/1157* (2013.01); *H01L 27/11521* (2013.01); *H01L 27/11526* (2013.01); *H01L 27/11565* (2013.01); *H01L 27/11573* (2013.01); *H01L 27/11575* (2013.01); *H01L 27/11582* (2013.01)

(58) Field of Classification Search
CPC ....................... H01L 27/11568; H01L 27/1521
See application file for complete search history.

(56) References Cited

U.S. PATENT DOCUMENTS 7,847,334 B2 12/2010 Katsumata et al.
8,013,389 B2 9/2011 Oh et al.
(Continued)

FOREIGN PATENT DOCUMENTS

KR 1082098 B1 11/2011
KR 1579587 B1 12/2015

*Primary Examiner* — Kenneth Parker
*Assistant Examiner* — Long H Le
(74) *Attorney, Agent, or Firm* — Volentine, Whitt & Francos, PLLC

(57) ABSTRACT

A vertical memory device includes a substrate having a cell array region and a connection region positioned on an exterior of the cell array region. Gate electrode layers are stacked on the cell array region and the connection region of the substrate, forming a stepped structure in the connection region. Channel structures are disposed in the cell array region, extending in a direction perpendicular to an upper surface of the substrate, while passing through the gate electrode layers. Dummy channel structures are disposed in the connection region, extending in the same direction as the channel structures, while passing through the gate electrode layers forming the stepped structure. First semiconductor patterns are disposed below the channel structures, and second semiconductor patterns are disposed below the dummy channel structures. The first and second semiconductor patterns include polycrystalline semiconductor materials.

20 Claims, 21 Drawing Sheets

(51) Int. Cl.
*H01L 27/11582* (2017.01)
*H01L 27/11575* (2017.01)
*H01L 27/11565* (2017.01)
*H01L 27/11521* (2017.01)
*H01L 27/11526* (2017.01)
*H01L 27/11573* (2017.01)

(56) References Cited

U.S. PATENT DOCUMENTS

| | | |
|---|---|---|
| 8,193,571 B2 | 6/2012 | Katsumata et al. |
| 8,237,211 B2 | 8/2012 | Fukuzumi et al. |
| 8,343,820 B2 | 1/2013 | Jung |
| 8,941,154 B2 | 1/2015 | Ahn |
| 9,076,865 B2 | 7/2015 | Lee et al. |
| 9,224,747 B2 | 12/2015 | Mizutani et al. |
| 9,305,934 B1 | 4/2016 | Ding et al. |
| 9,337,237 B2 | 5/2016 | Tang et al. |
| 2014/0048873 A1 | 2/2014 | Shim et al. |
| 2015/0340376 A1* | 11/2015 | Park .................. H01L 23/528 257/329 |
| 2016/0027796 A1* | 1/2016 | Yang ................ H01L 27/11573 257/314 |
| 2016/0225785 A1* | 8/2016 | Kim ................. H01L 27/11575 |
| 2016/0351497 A1* | 12/2016 | Peri .................... H01L 23/5226 |
| 2017/0040337 A1* | 2/2017 | Kim .................. H01L 27/11582 |
| 2017/0062454 A1* | 3/2017 | Lu .................... H01L 29/7926 |
| 2018/0130812 A1* | 5/2018 | Hosoda ............. H01L 27/11556 |

\* cited by examiner

VERTICAL MEMORY DEVICE

CROSS-REFERENCE TO RELATED APPLICATION

This application claims priority to Korean Patent Application No. 10-2016-0145696, filed on Nov. 3, 2016 in the Korean Intellectual Property Office, the disclosure of which is incorporated herein by reference in its entirety.

BACKGROUND

1. Field

The present disclosure relates to a vertical memory device.

2. Description of Related Art

Electronic devices have gradually become smaller, while still being required to process large amounts of data. Accordingly, the degree of integration of semiconductor memory devices used in such electronic products is required to be increased. As a method of increasing the degree of integration of semiconductor memory devices, a vertical memory device having a vertical transistor structure, in lieu of a conventional planar transistor structure, has been proposed.

SUMMARY

An aspect of the present disclosure may provide a vertical memory device having improved reliability.

According to an aspect of the present disclosure, a vertical memory device may include: a substrate having a cell array region and a connection region positioned on an exterior of the cell array region; a plurality of gate electrode layers stacked on the cell array region and the connection region of the substrate, forming a stepped structure in the connection region; a plurality of channel structures disposed in the cell array region, extending in a direction perpendicular to an upper surface of the substrate, while passing through the gate electrode layers; a plurality of dummy channel structures disposed in the connection region, extending in the same direction as the channel structures, while passing through the gate electrode layers forming the stepped structure; a plurality of first semiconductor patterns disposed below the channel structures; and a plurality of second semiconductor patterns disposed below the dummy channel structures. The first and second semiconductor patterns may include polycrystalline semiconductor materials.

According to another aspect of the present disclosure, a vertical memory device may include: a substrate having a cell array region, a peripheral circuit region, and a connection region positioned between the cell array region and the peripheral circuit region; a plurality of first semiconductor patterns disposed in the cell array region; a plurality of second semiconductor patterns disposed in the connection region, and having a diameter or width different from a diameter or width of the first semiconductor patterns; and a circuit transistor disposed in the peripheral circuit region. The first and second semiconductor patterns may include polycrystalline semiconductor materials.

According to another aspect of the present disclosure, a vertical memory device includes a substrate having a cell array region and a connection region positioned adjacent to the cell array region. A plurality of gate electrode layers is vertically stacked on the cell array region and the connection region of the substrate. A plurality of first semiconductor patterns is vertically disposed between the substrate and the gate electrode layers within the cell array region. A plurality of second semiconductor patterns is vertically disposed between the substrate and the gate electrode layers within the connection region. And the first semiconductor patterns and the second semiconductor patterns have substantially the same vertical height above the substrate.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, the example embodiments of the present disclosure will be described below with reference to the attached drawings.

Figure 1:
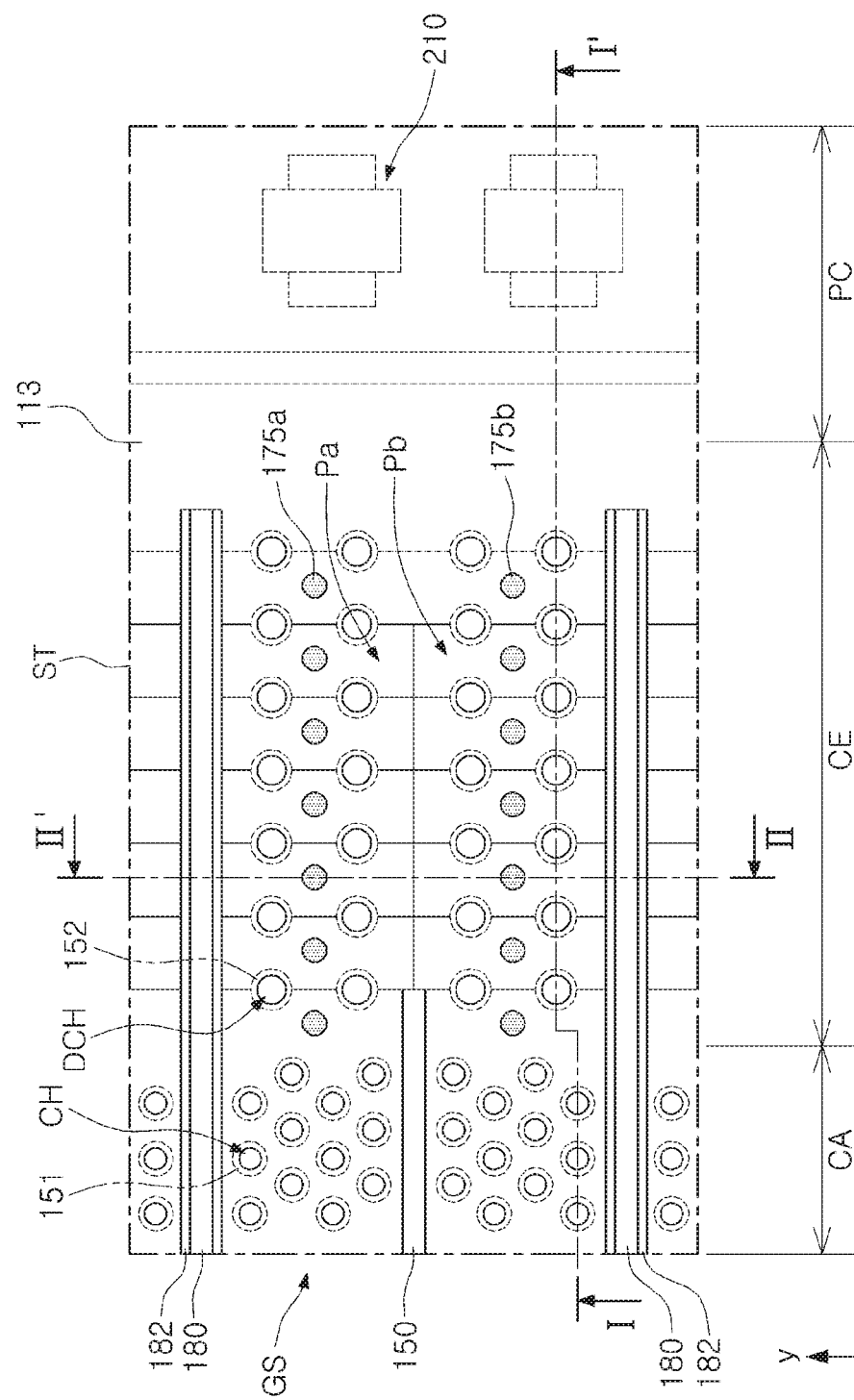
FIG. 1 is a schematic plan view of a vertical memory device according to an example embodiment of the present disclosure.

FIG. 1 is a schematic plan view of a vertical memory device according to an example embodiment of the present disclosure. FIG. 1 is illustrated without some components of FIG. 2, for example, a third interlayer insulating layer 170 is omitted, for ease of description.

Referring to FIG. 1, the vertical memory device according to an example embodiment may include a cell array region CA on which memory cells are formed, a connection region CE in which the memory cells are connected to a wiring, and a peripheral circuit region PC on which peripheral circuits are formed to control the memory cells. FIG. 1 illustrates a portion of the cell array region CA. As illustrated in FIG. 1, the connection region CE may be disposed on one side of the cell array region CA, but the connection region CE may be disposed on opposite sides of the cell array region CA.

The peripheral circuit region PC may be provided on an exterior of the connection region CE, and a plurality of circuit transistors 210 may be disposed in the peripheral circuit region PC.

A gate stack GS, divided into a plurality of blocks in a y-axis direction by a common source line 180, may be disposed in the cell array region CA and the connection region CE. The gate stack GS may include a plurality of gate electrode layers and a plurality of mold insulating layers alternately stacked on a substrate. The common source line 180 may extend from the cell array region CA to the connection region CE. The common source line 180 may be electrically connected to the substrate. The common source line 180 may include a conductive material. For example, the common source lines 180 may include tungsten (W). An insulating layer 182 may be disposed between the common source line 180 and the gate stack GS, and the insulating layer 182 may electrically insulate the common source line 180 from the gate electrode layers of the gate stack GS. The insulating layers 182 may include silicon oxide ($SiO_2$), silicon nitride ($Si_3N_4$), silicon oxynitride (SiON) or combinations thereof.

The cell array region CA may have a plurality of channel structures CHs disposed therein to pass through the gate stack GS, and the connection region CE may have a plurality of dummy channel structures DCHs and a plurality of first and second contact plugs 175a and 175b disposed thereon.

The gate stack GS may, for example, form a first stepped structure extending in an x-axis direction and including a plurality of step layers ST in the connection region CE. The first stepped structures may be formed by the gate electrode layers and the mold insulating layers extending from the cell array region CA in the x-axis direction by different lengths. Each of the step layers ST may include a first pad region Pa and a second pad region Pb. The gate stack GS may include a plurality of first pad regions Pa and a plurality of second pad regions Pb. The first pad regions Pa may have the first contact plugs 175a disposed therein, and the second pad regions Pb may have the second contact plugs 175b disposed therein.

Figure 2:
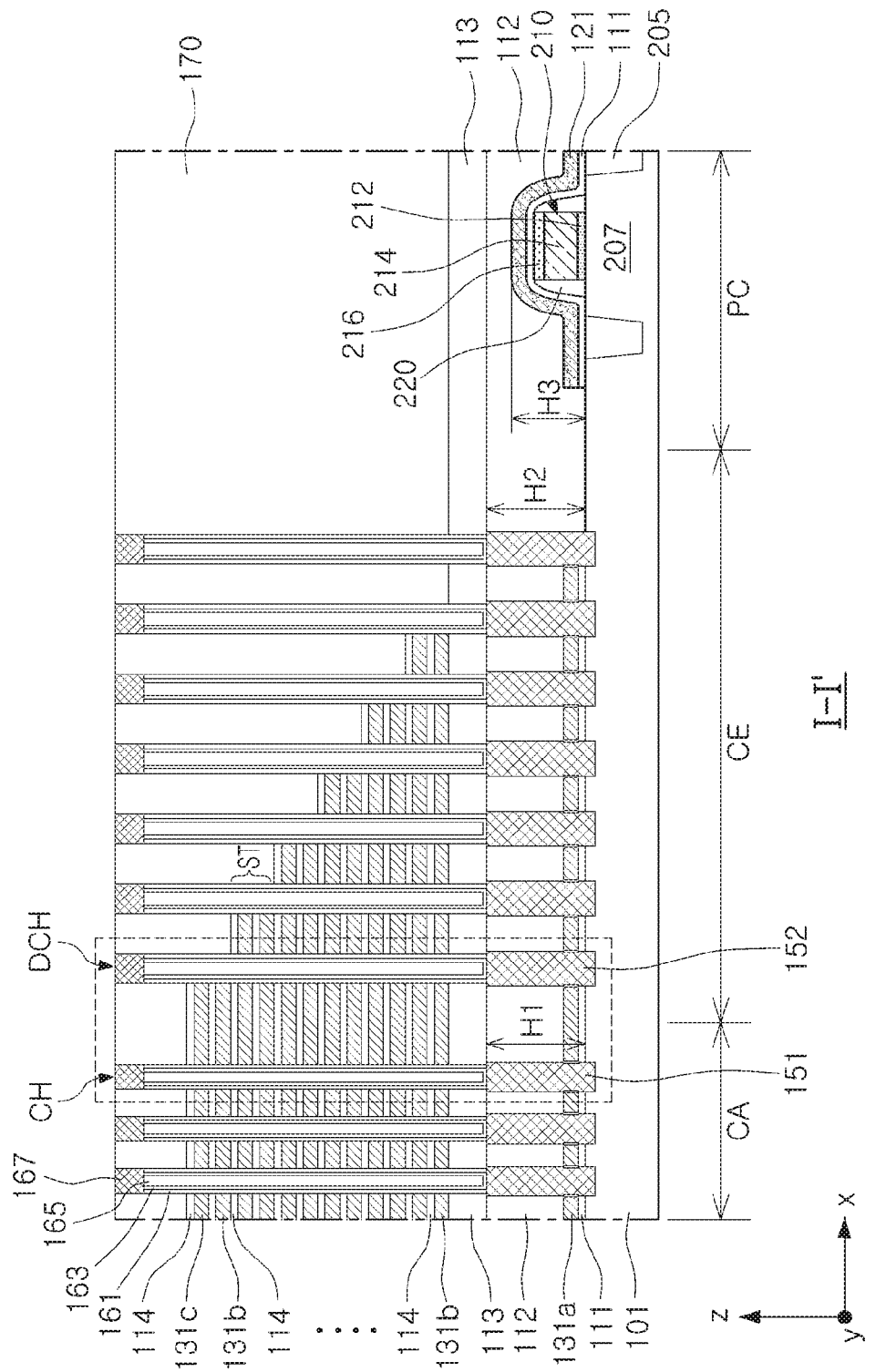
FIGS. 2 through 4 are schematic cross-sectional views of a vertical memory device according to an example embodiment of the present disclosure.

The gate stack GS may have a separation insulation pattern 150 disposed in an upper portion thereof, and the separation insulation pattern 150 may divide, into two regions, an uppermost gate electrode layer 131c of FIG. 2 provided as a string select line.

The cell array region CA may have the channel structures CHs disposed in a plurality of columns in the x-axis direction. FIG. 1 illustrates 8 columns of channel structures CHs between a pair of common source lines 180 as an example. The channel structures CHs may be disposed in zigzag form. An arrangement of the channel structures CHs is not limited to that illustrated in FIG. 1, and may be modified in various manners. In an example embodiment, a portion of the channel structures CHs may be formed in a region in which the separation insulation pattern 150 is disposed, and such channel structures CHs may be dummy channel structures that are not connected to a bit line.

The dummy channel structures DCHs may be disposed adjacent to edges of the respective step layers ST. The dummy channel structures DCHs are disposed in four columns in the x-axis direction, as illustrated in FIG. 1, but an arrangement of the dummy channel structures DCHs is not limited to that illustrated in FIG. 1. For example, a portion of the dummy channel structures DCHs may be disposed adjacent to the edges of the respective step layers ST, and the remainder of the dummy channel structures DCHs may be disposed inside the respective step layers ST.

The channel structures CHs may have first semiconductor patterns 151 individually disposed therebelow. The dummy channel structures DCHs may have second semiconductor patterns 152 individually disposed therebelow.

Figure 3:
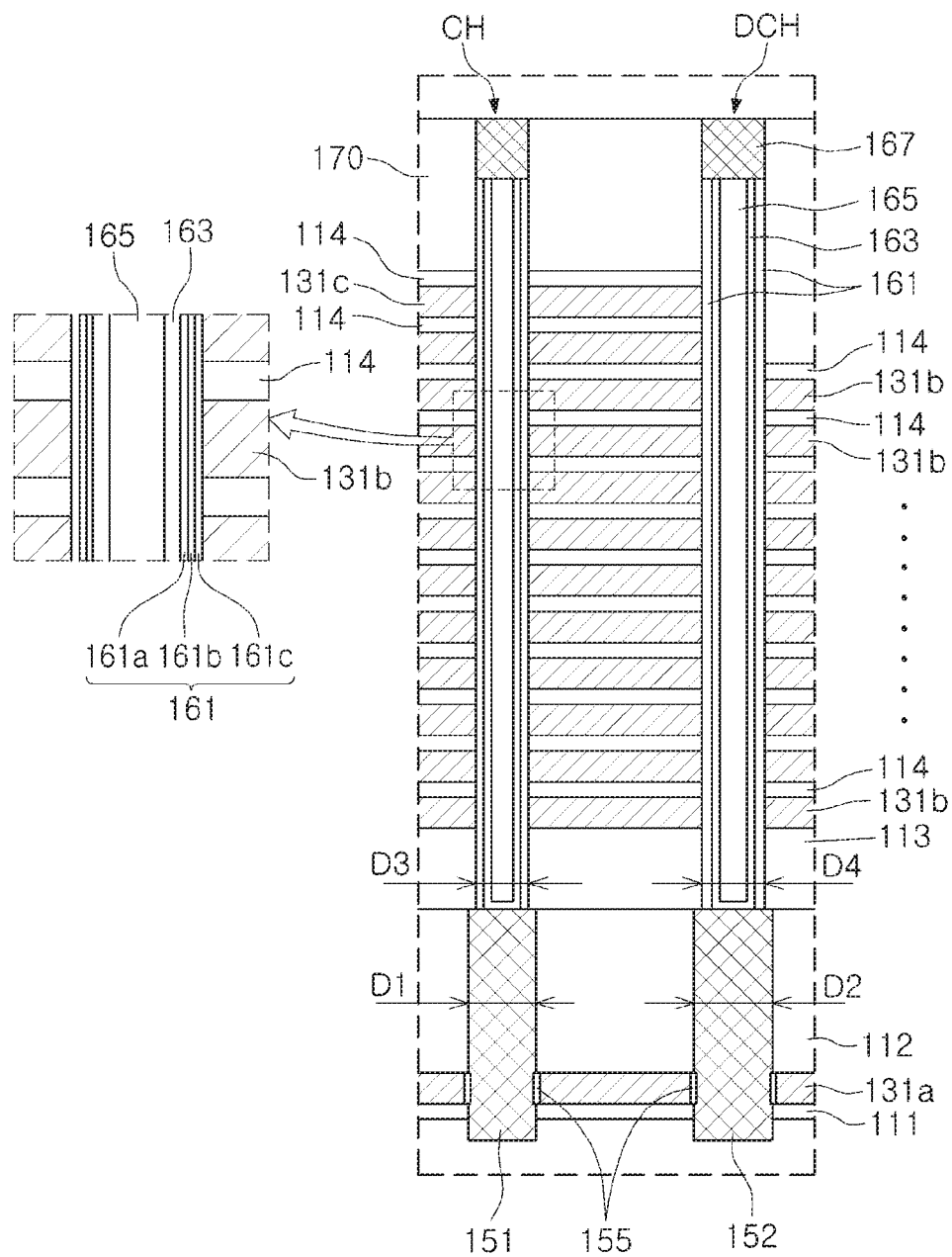
Figure 4:
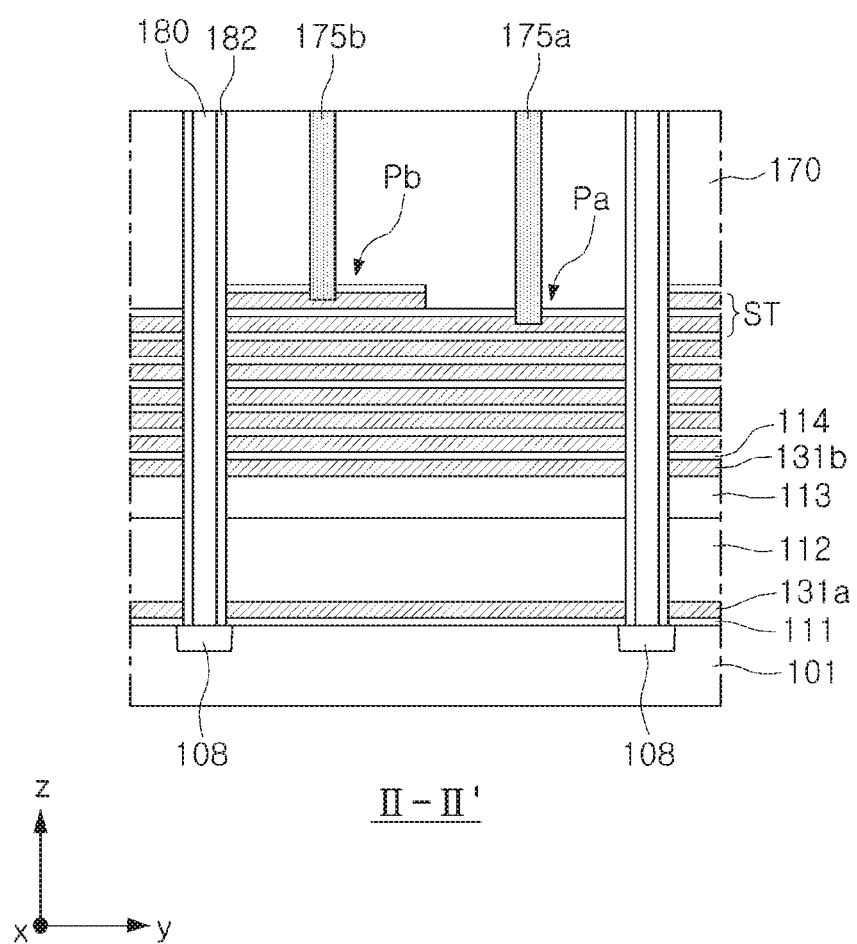

FIGS. 2 through 4 are schematic cross-sectional views of a vertical memory device according to an example embodiment of the present disclosure. FIG. 2 is a cross-sectional view taken along line I-I' of FIG. 1, and FIG. 3 is an enlarged view of a region indicated by a dotted line in FIG. 2. FIG. 4 is a cross-sectional view taken along line II-II' of FIG. 1.

Referring to FIG. 2, a plurality of gate electrode layers 131a, 131b, and 131c may be stacked on a substrate 101, and may be spaced apart from each other in a z-axis direction. The gate stack GS may extend from the cell array region CA to the connection region CE. The cell array region CA may have the channel structures CHs, passing through the gate electrode layers 131b, and 131c, and the first semiconductor patterns 151 disposed below the channel structures CHs. The connection region CE may have the dummy channel structures DCHs, passing through at least a portion of the gate electrode layer 131b, and 131c, and the second semiconductor patterns 152 disposed below the dummy channel structures DCHs. The peripheral circuit region PC may have the circuit transistors 210 and a sacrificial layer 121 covering the circuit transistors 210. The sacrificial layer 121, formed in the peripheral circuit region PC, may be an etch stop layer.

The substrate 101 may have an upper surface extending in the x- and y-axis directions. The substrate 101 may include a semiconductor material, such as a group IV semiconductor material, a group III-V compound semiconductor material, or a group II-VI compound semiconductor material.

A lowermost gate electrode layer 131a of the gate stack GS, may be provided as a ground select line or a lower select line, gate electrode layers 131b may be provided as word lines, and an uppermost gate electrode layer 131c may be provided as a string select line or an upper select line. The gate electrode layers 131b may have mold insulating layers 114 disposed therebetween. The lowermost gate electrode layer 131a and the substrate 101 may have a buffer insulating layer 111 disposed therebetween. A first interlayer insulating layer 112 and a second interlayer insulating layer 113 may be sequentially disposed between the lowermost gate electrode layer 131a and a gate electrode layer 131b adjacent thereto. The first interlayer insulating layer 112 may be disposed closer to the substrate 101, and the second interlayer insulating layer 113 may be disposed on the first interlayer insulating layer 112.

Each of the circuit transistors 210 may include an active region 207, a circuit gate dielectric layer 212, and a circuit gate electrode 214. The circuit gate electrode 214 may have a capping layer 216 formed thereon, and may have a spacer 220 formed on a lateral surface thereof. The peripheral circuit region PC may have the sacrificial layer 121 disposed therein to cover the circuit transistor 210. The sacrificial layer 121 and the circuit transistor 210 may have the buffer insulating layer 111 disposed therebetween. The first and second interlayer insulating layers 112 and 113 may fully cover the sacrificial layer 121 disposed on the circuit transistor 210.

The first and second semiconductor patterns 151 and 152 may extend to the substrate 101 through the lowermost gate electrode layer 131a, the first interlayer insulating layer 112, and the buffer insulating layer 111. A first height H1 of the first semiconductor patterns 151 may be substantially the same as a second height H2 of the second semiconductor patterns 152. A third height H3 of the sacrificial layer 121, covering the circuit transistor 210, may be lower than the first height H1 of the first semiconductor patterns 151 and the second height H2 of the second semiconductor patterns 152. For example, upper surfaces of the first semiconductor patterns 151 and upper surfaces of the second semiconductor patterns 152 may be higher than an upper surface of the sacrificial layer 121. The first to third heights H1 to H3 may be measured based on an upper surface of the substrate 101. The upper surfaces of the first semiconductor patterns 151 and the upper surfaces of the second semiconductor patterns 152 may be coplanar with an upper surface of the first interlayer insulating layer 112.

The number of the lowermost gate electrode layer 131a, the gate electrode layers 131b and the uppermost gate electrode layer 131c forming the gate stack GS is not limited to that of the lowermost gate electrode layer 131a, the gate electrode layers 131b, and the uppermost gate electrode layer 131c illustrated in FIG. 2. Depending on storage capacity of a vertical memory device, the number of gate electrode layers 131b forming memory cells may be determined, and for example, tens to hundreds of gate electrode layers 131b may be stacked on the substrate 101.

The lowermost gate electrode layer 131a, the gate electrode layers 131b, and the uppermost gate electrode layer 131c may extend from the cell array region CA to the connection region CE in the x-axis direction. The lowermost gate electrode layer 131a, the gate electrode layers 131b, and the uppermost gate electrode layer 131c may extend in the connection region CE in the x-axis direction by different lengths to form the first stepped structure. For example, each of the step layers ST, forming the first stepped structure, may include two gate electrode layers 131b. A lowermost step layer ST of the step layers ST may include a single gate electrode layer 131a. The mold insulating layers 114 may form the first stepped structure along with the gate electrode layers 131b.

Referring to FIG. 4, when viewed from above the substrate 101, two respective gate electrode layers 131b forming the respective step layers ST may have a portion in which the two respective gate electrode layers 131b do not overlap each other. A portion of an upper gate electrode layer 131b may be removed from each of the step layers ST.

In each of the step layers ST, a portion of a lower gate electrode layer 131b not covered by the upper gate electrode layer 131b may be provided as the first pad region Pa, and the upper gate electrode layer 131b may be provided as the second pad region Pb spaced apart from the first pad region Pa in the z-axis direction. As a result, a stepped structure may be formed to have a short length in the y-axis direction within each of the step layers ST forming the first stepped structure. For example, the first and second pad regions Pa and Pb may form a second stepped structure in the y-axis direction within each of the step layers ST.

In an example embodiment, in the connection region CE, each of the step layers ST forming the first stepped structure may include three gate electrode layers, and the second stepped structure may include three pad regions provided by the three gate electrode layers. Further, in the connection region CE, a second stepped structure including four or more pad regions may be formed in each of the step layers ST having the first stepped structure.

The common source line 180 may extend to the substrate 101, dividing the third interlayer insulating layer 170, the gate electrode layers 131b, and the like, in a vertical direction thereof, and may be connected to an impurity region 108.

The lowermost gate electrode layer 131a, the gate electrode layers 131b, and the uppermost gate electrode layer 131c may include a conductive material. The lowermost gate electrode layer 131a, the gate electrode layers 131b, and the uppermost gate electrode layer 131c may include a metal material, a metal nitride, a metal silicide material, polycrystalline silicon, and combinations thereof. The metal material may include, for example, tungsten (W). The metal silicide material may include, for example, a silicide material of a metal selected from among, for example, cobalt (Co), nickel (Ni), hafnium (Hf), platinum (Pt), tungsten (W) and titanium (Ti), or may be combinations thereof. The metal nitride may include, for example, tungsten nitride (WN), tantalum nitride (TaN), titanium nitride (TiN), or combinations thereof. The buffer insulating layer 111 and the mold insulating layers 114 may include silicon oxides. The first and second interlayer insulating layers 112 and 113 may include silicon oxides and low-k dielectric materials. The first and second semiconductor patterns 151 and 152 may include polycrystalline semiconductor materials. The first and second semiconductor patterns 151 and 152 may include, for example, polycrystalline silicon or polycrystalline silicon-germanium. The common source line 180 may include, for example, tungsten.

Referring to FIGS. 2 and 3, the channel structures CHs may be disposed in the cell array region CA. The channel structures CHs may extend to the first semiconductor patterns 151 through the third interlayer insulating layer 170, the gate electrode layers 131b, and the second interlayer insulating layer 113. The dummy channel structures DCHs may extend to the second semiconductor patterns 152 through the third interlayer insulating layer 170, the gate electrode layers 131b, and the second interlayer insulating layer 113. The channel structures CHs and the dummy channel structures DCHs may include a gate dielectric layer 161, a channel layer 163, a filled insulating layer 165, and a contact pad 167, respectively. In the channel structures CHs and the dummy channel structures DCHs, a lower end portion of the channel layer 163 may contact the first or second semiconductor patterns 151 and 152 to be electrically connected thereto, and an upper end portion of the channel layer 163 may contact the contact pad 167 to be electrically connected thereto. Ground select gate dielectric layers 155 may be partially disposed between the first semiconductor patterns 151 and the lowermost gate electrode layer 131a and between the second semiconductor patterns 152 and the lowermost gate electrode layer 131a. The ground select gate dielectric layers 155 may be formed by oxidizing portions of the first and second semiconductor patterns 151 and 152.

The second semiconductor patterns 152 may have a greater diameter or width than a diameter or width of the first semiconductor patterns 151. A second diameter D2 of the second semiconductor patterns 152 may be greater than a first diameter D1 of the first semiconductor patterns 151.

The dummy channel structures DCHs may have a greater diameter or width than a diameter or width of the channel structures CHs. A fourth diameter D4 of the dummy channel structures DCHs may be greater than a third diameter D3 of the channel structures CHs.

The gate dielectric layer 161 may surround an outer surface of the channel layer 163. The gate dielectric layer 161 may include a tunneling layer 161a, a charge storage layer 161b, and a blocking layer 161c sequentially disposed from the outer surface of the channel layer 163.

The channel layer 163 may have a pipe shape of which a lower end portion is closed. An internal space of the channel layer 163 may be filled by the filled insulating layer 165. The channel layer 163 may include a semiconductor material, such as polycrystalline silicon or monocrystalline silicon.

The tunneling layer 161a may include, for example, a silicon oxide. A vertical memory device, according to an example embodiment, may allow electrons to move to the charge storage layer 161b through the tunneling layer 161a in an F-N tunneling manner. The charge storage layer 161b may be a charge trapping layer or a floating gate conductive layer. For example, the charge storage layer 161b may include a dielectric material such as a silicon nitride, quantum dots, or nanocrystals. Here, the quantum dots or nanocrystals may include a conductor, for example, microparticles of a metal or a semiconductor material. The blocking layer 161c may include $SiO_2$, silicon nitride ($Si_3N_4$), silicon oxynitride (SiON), or a high-k dielectric material. The high-k dielectric material may be any one among aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Figure 5:
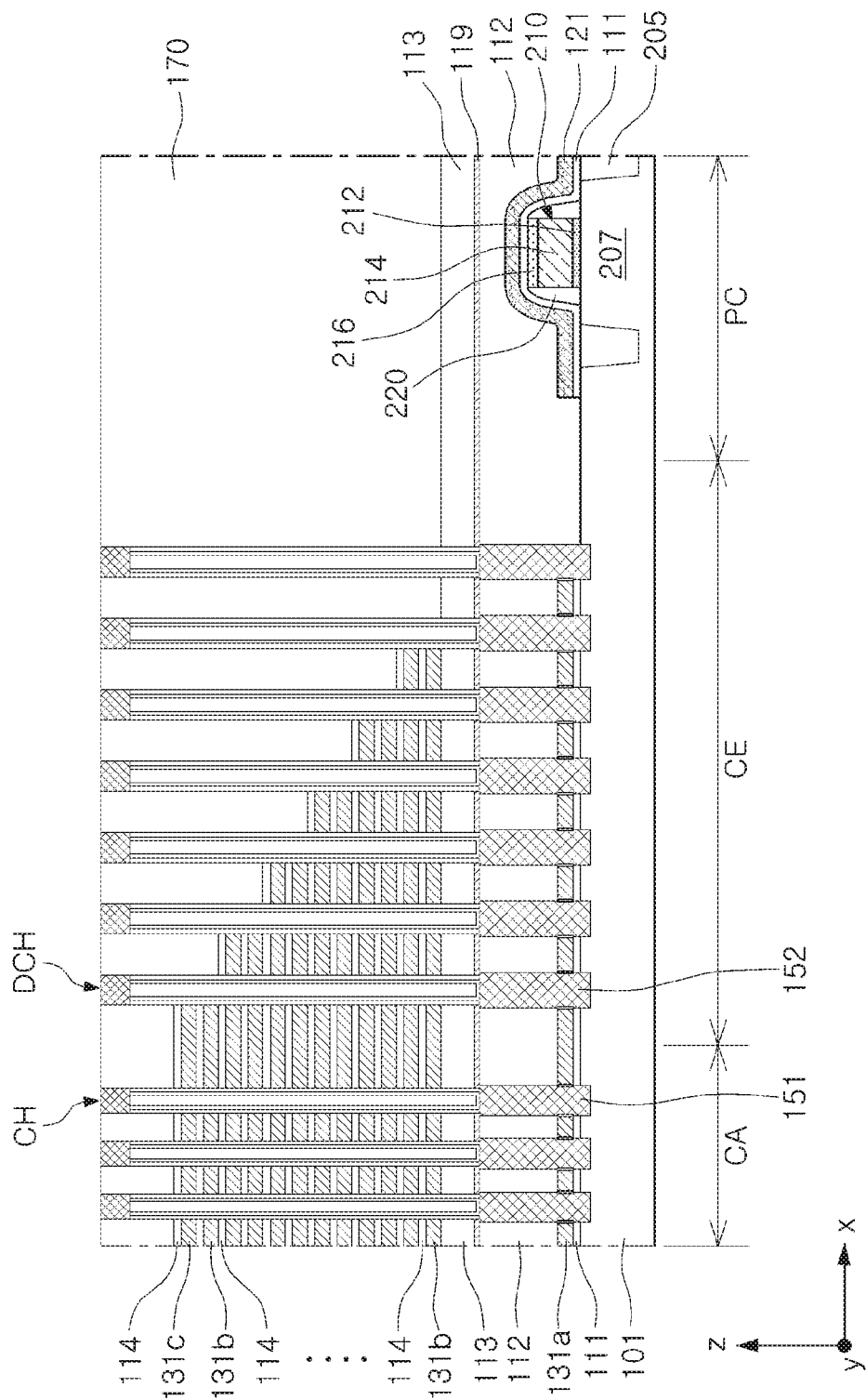
FIG. 5 is a schematic cross-sectional view of a vertical memory device according to another example embodiment of the present disclosure.

FIG. 5 is a schematic cross-sectional view of a vertical memory device according to another example embodiment of the present disclosure.

Referring to FIG. 5, a vertical memory device according to another example embodiment may further include an interface insulating layer 119 disposed between the first and second interlayer insulating layers 112 and 113, compared with the vertical memory device illustrated in FIG. 2. The interface insulating layer 119 may include, for example, aluminum oxide. The remaining components of the vertical memory device, illustrated in FIG. 5, are the same as those of the vertical memory device, illustrated in FIG. 2, and thus, description thereof will be omitted.

Figure 16:
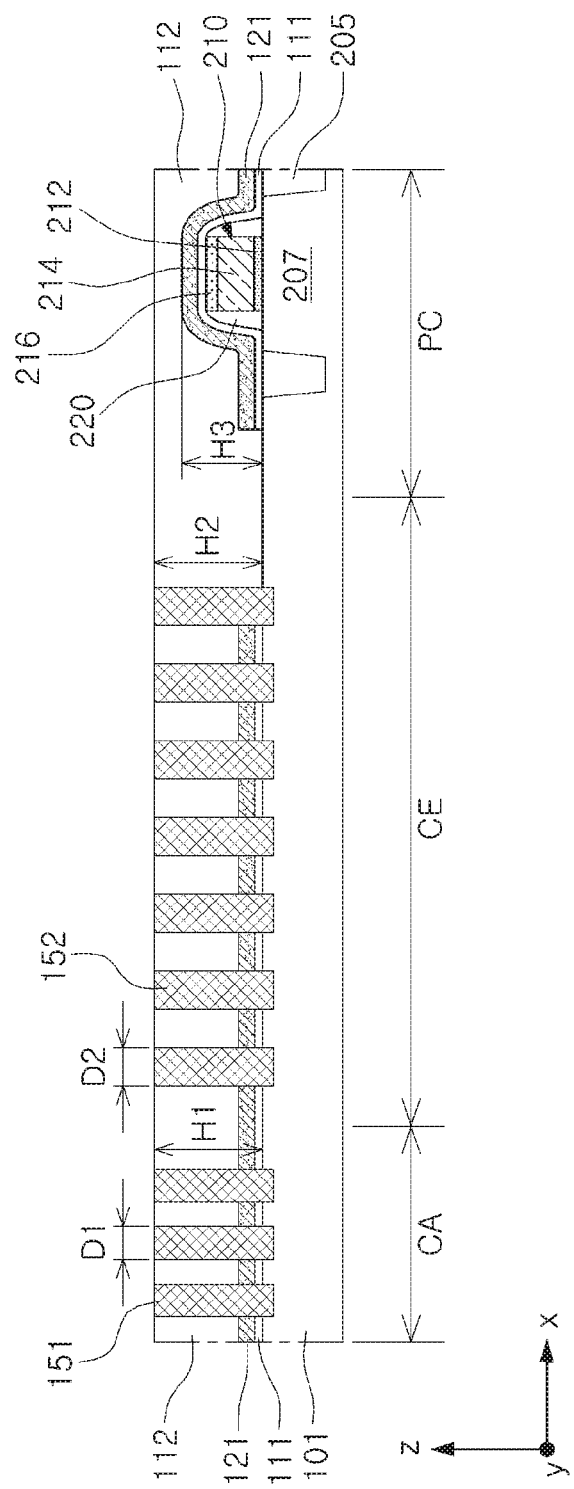
Figure 17:
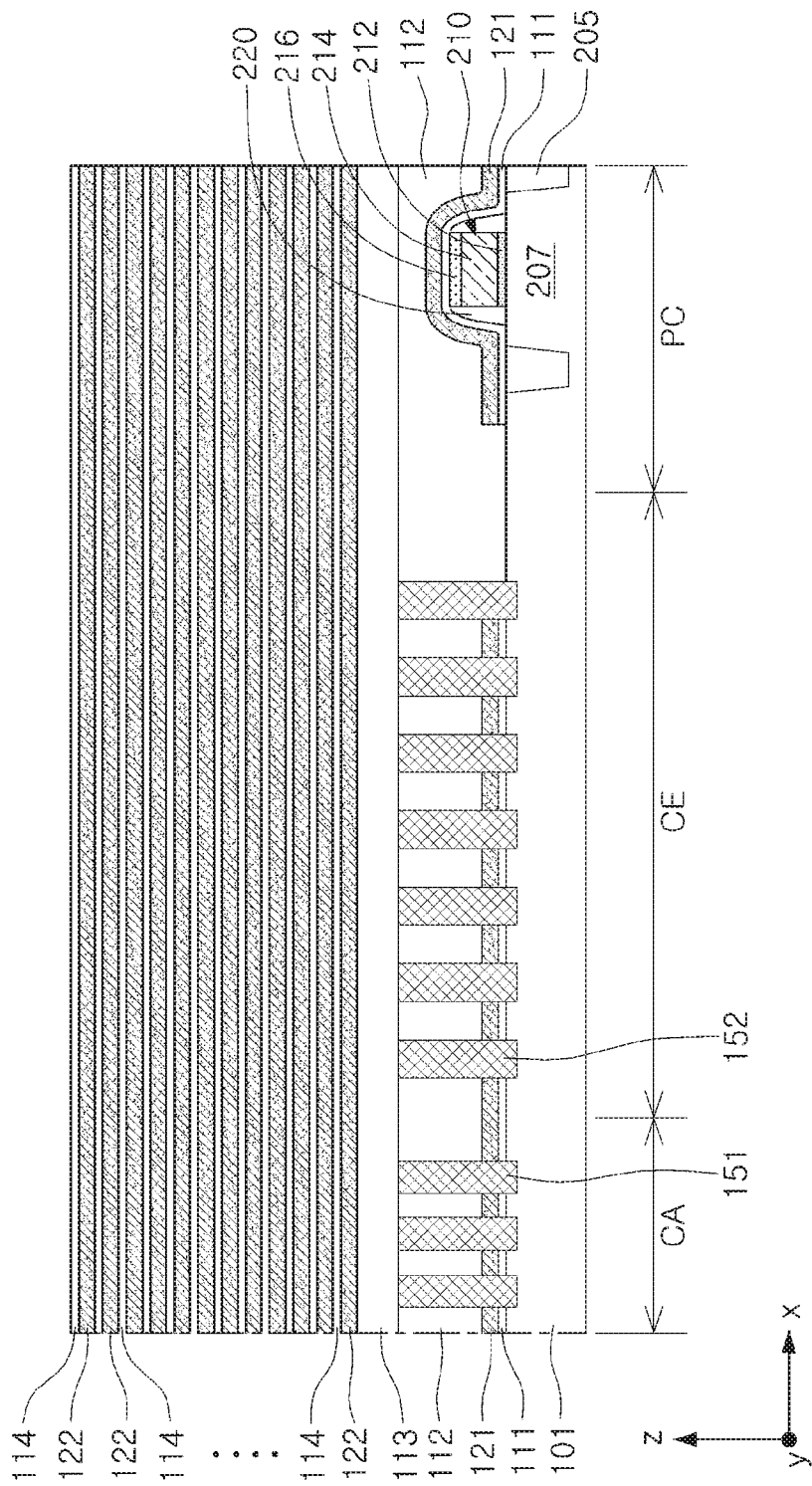

A structure of the vertical memory device of FIG. 5 may be obtained by further forming the interface insulating layer 119 on a structure, illustrated in FIG. 16, and then performing processes subsequent to that of FIG. 17.

The interface insulating layer 119 may be used as an etch stop layer for an anisotropic etching process of forming channel holes HL3 and dummy channel holes HL4 as described with reference to FIG. 19. The interface insulating layer 119 may also prevent the first and second semiconductor patterns 151 and 152, exposed to lower surfaces of the channel holes HL3 and the dummy channel holes HL4, from being non-uniformly etched by the anisotropic etching process.

Figure 6:
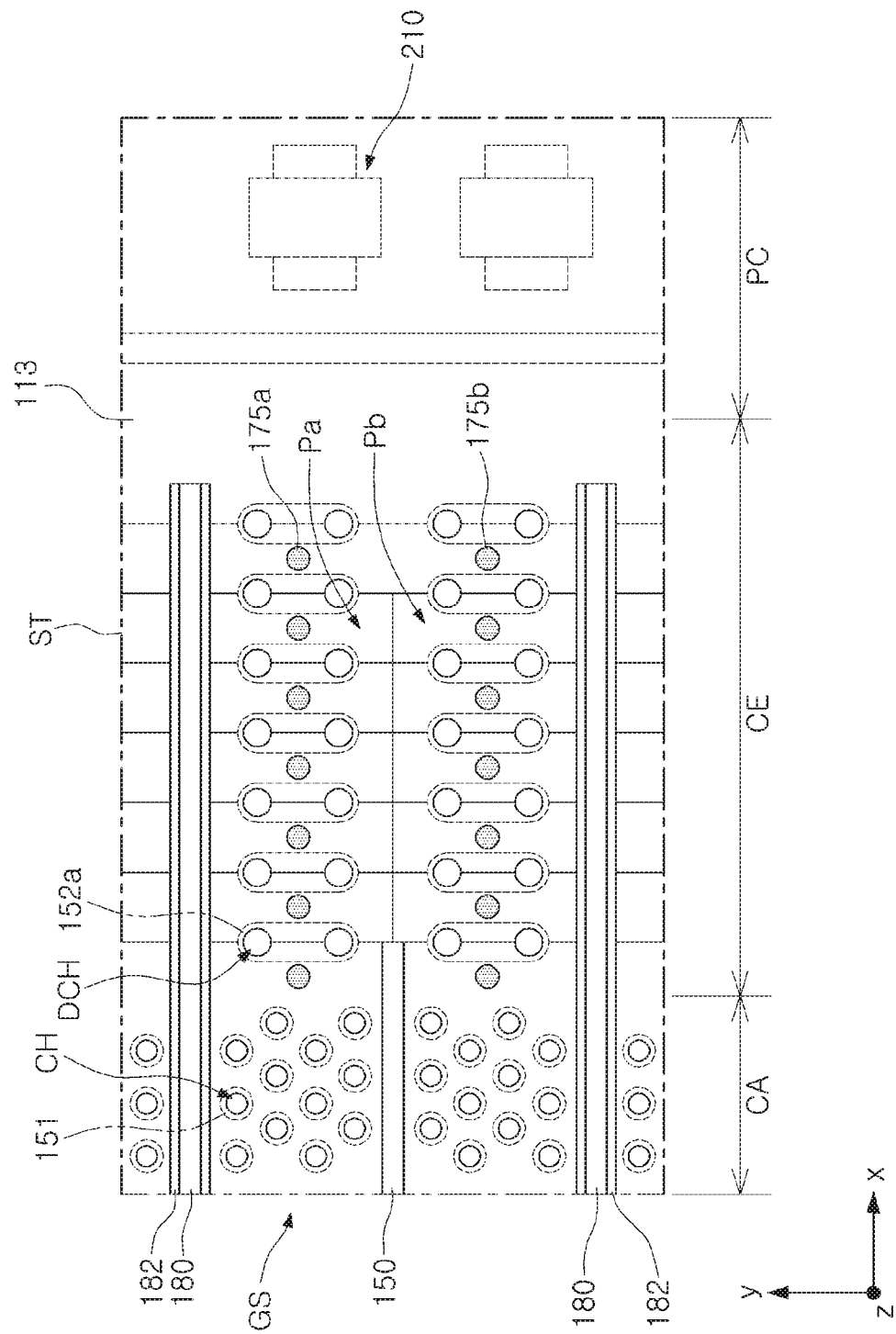
FIGS. 6 and 7 are schematic plan views of vertical memory devices according to other example embodiments of the present disclosure.
Figure 7:
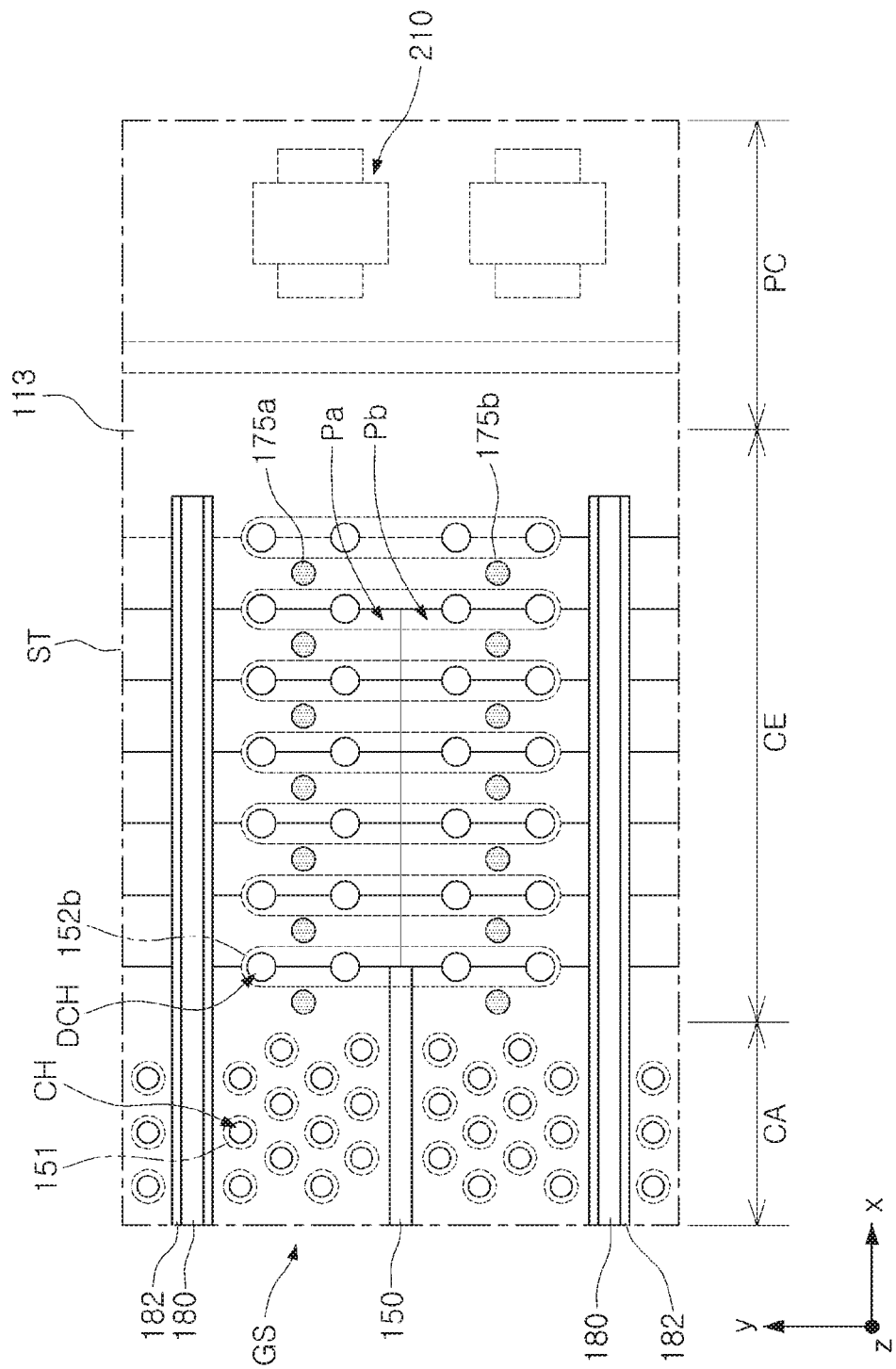

FIGS. 6 and 7 are schematic plan views of vertical memory devices according to other example embodiments of the present disclosure.

The vertical memory devices, illustrated in FIGS. 6 and 7, may differ from the vertical memory device, illustrated in FIG. 1, in shapes of second semiconductor patterns 152a and 152b. In the case of the vertical memory device, illustrated in FIG. 1, the first and second semiconductor patterns 151 and 152 may have cylindrical shapes. In the case of the vertical memory devices, illustrated in FIGS. 6 and 7, the first and second semiconductor patterns 151, 152a, and 152b may have different shapes. For example, the first semiconductor patterns 151 may have a cylindrical shape, and the second semiconductor patterns 152a and 152b may have a bar shape extending in the first direction, for example, the y-axis direction. In the case of the vertical memory device, illustrated in FIG. 6, the second semiconductor patterns 152a may commonly contact two dummy channel structures DCHs disposed adjacent to each other in the first direction, for example, the y-axis direction.

In the case of the vertical memory device, illustrated in FIG. 7, the second semiconductor patterns 152b may commonly contact four dummy channel structures DCHs disposed in the first direction, for example, the y-axis direction. The second semiconductor patterns 152b may commonly contact all of the dummy channel structures DCHs disposed in the first direction, for example, the y-axis direction, between a pair of common source lines 180.

The remaining components of the vertical memory devices, illustrated in FIGS. 6 and 7, may be the same as those of the vertical memory device, illustrated in FIG. 1, and thus, descriptions thereof will be omitted.

Figure 8:
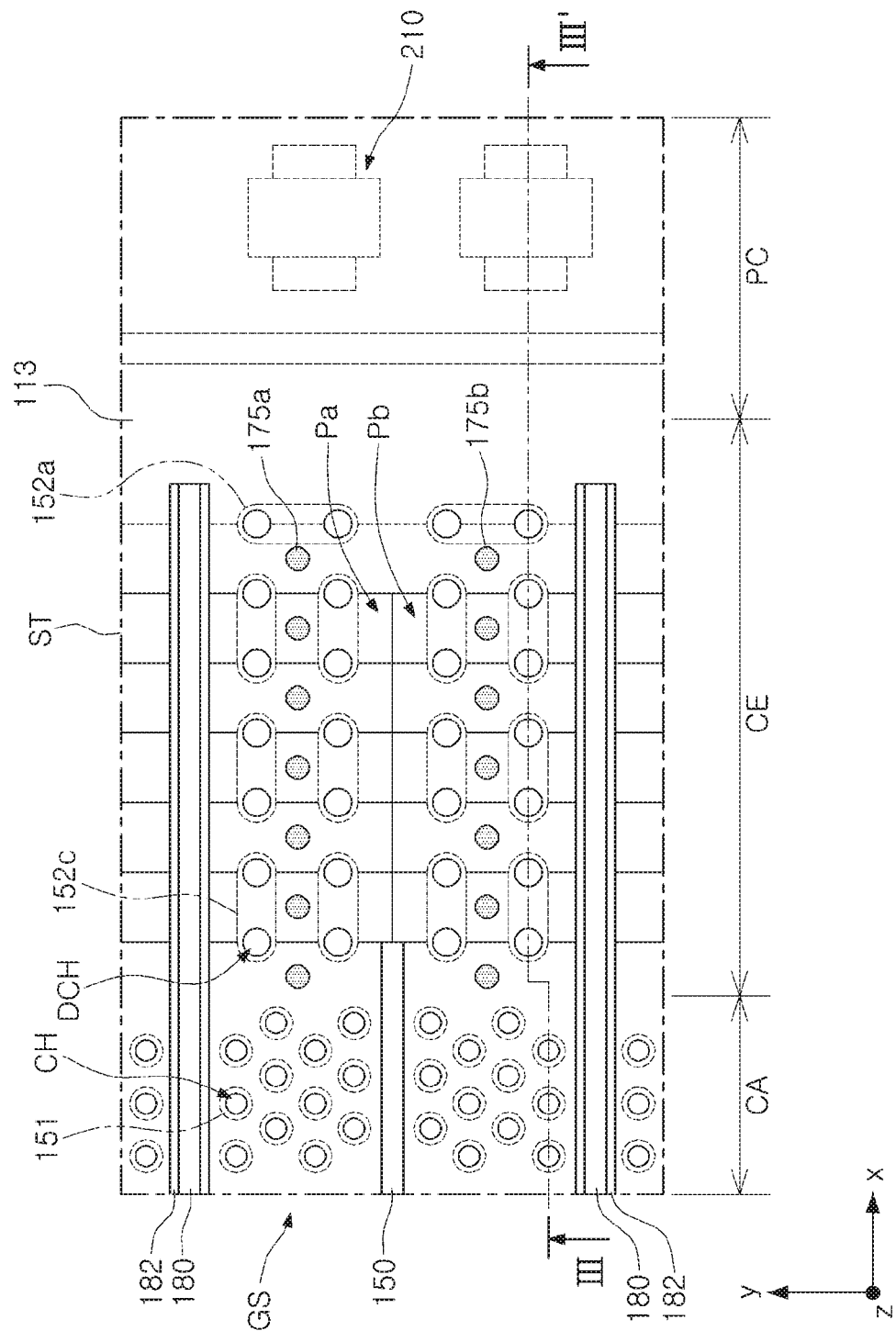
FIGS. 8 and 9 are schematic plan and cross-sectional views of a vertical memory device according to another example embodiment of the present disclosure, respectively.
Figure 9:
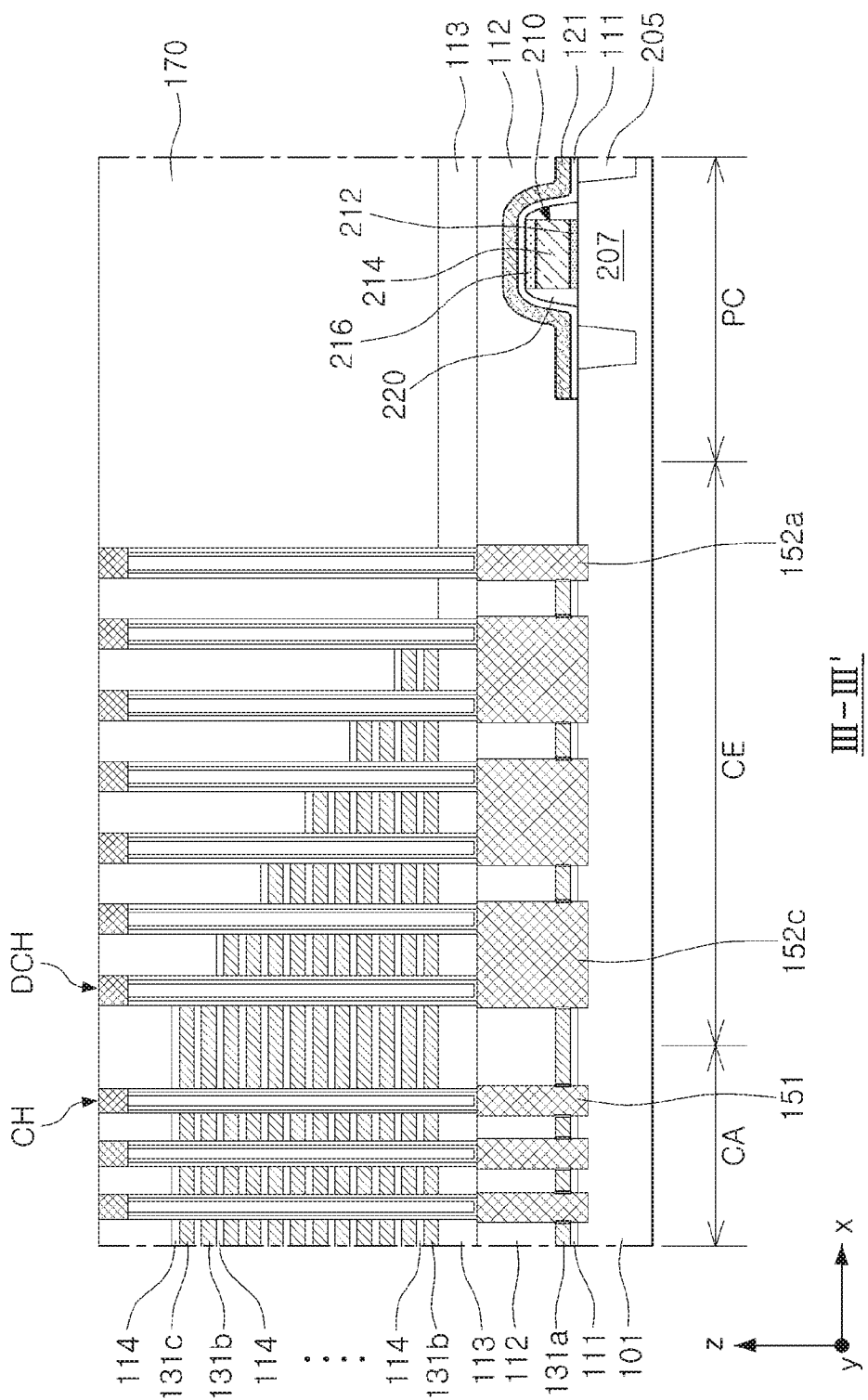

FIGS. 8 and 9 are schematic plan and cross-sectional views of a vertical memory device according to another example embodiment of the present disclosure, respectively.

The vertical memory device, illustrated in FIGS. 8 and 9, may differ from the vertical memory device, illustrated in FIGS. 1 and 2, in terms of shapes of second semiconductor patterns 152a and 152c.

In this example embodiment, the second semiconductor patterns 152a and 152c may include first patterns 152a, having a bar shape extending in the first direction, for example, the y-axis direction, and second patterns 152c having a bar shape extending in the second direction, for example, the x-axis direction. The first patterns 152a may commonly contact two dummy channel structures DCHs disposed adjacent to each other in the first direction, for example, the y-axis direction, and the second patterns 152c may commonly contact two dummy channel structures DCHs disposed adjacent to each other in the second direction, for example, the x-axis direction. As an example, the first patterns 152a may be disposed at the edge of the stepped structure, formed in the connection region CE, and a disposition of the first patterns 152a may be modified in various manners.

Figure 10:
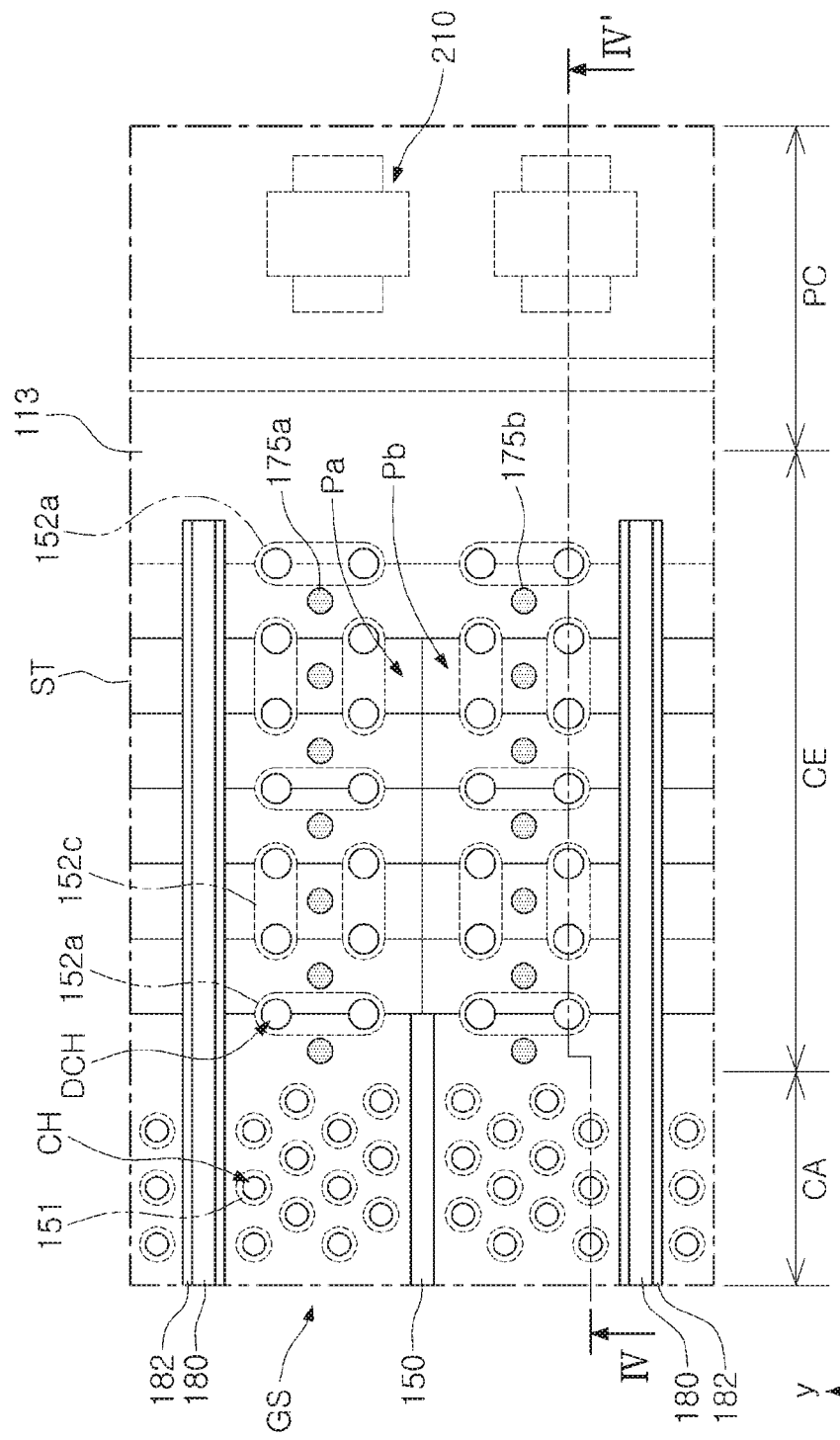
FIGS. 10 and 11 are schematic plan and cross-sectional views of a vertical memory device according to another example embodiment of the present disclosure, respectively.
Figure 11:
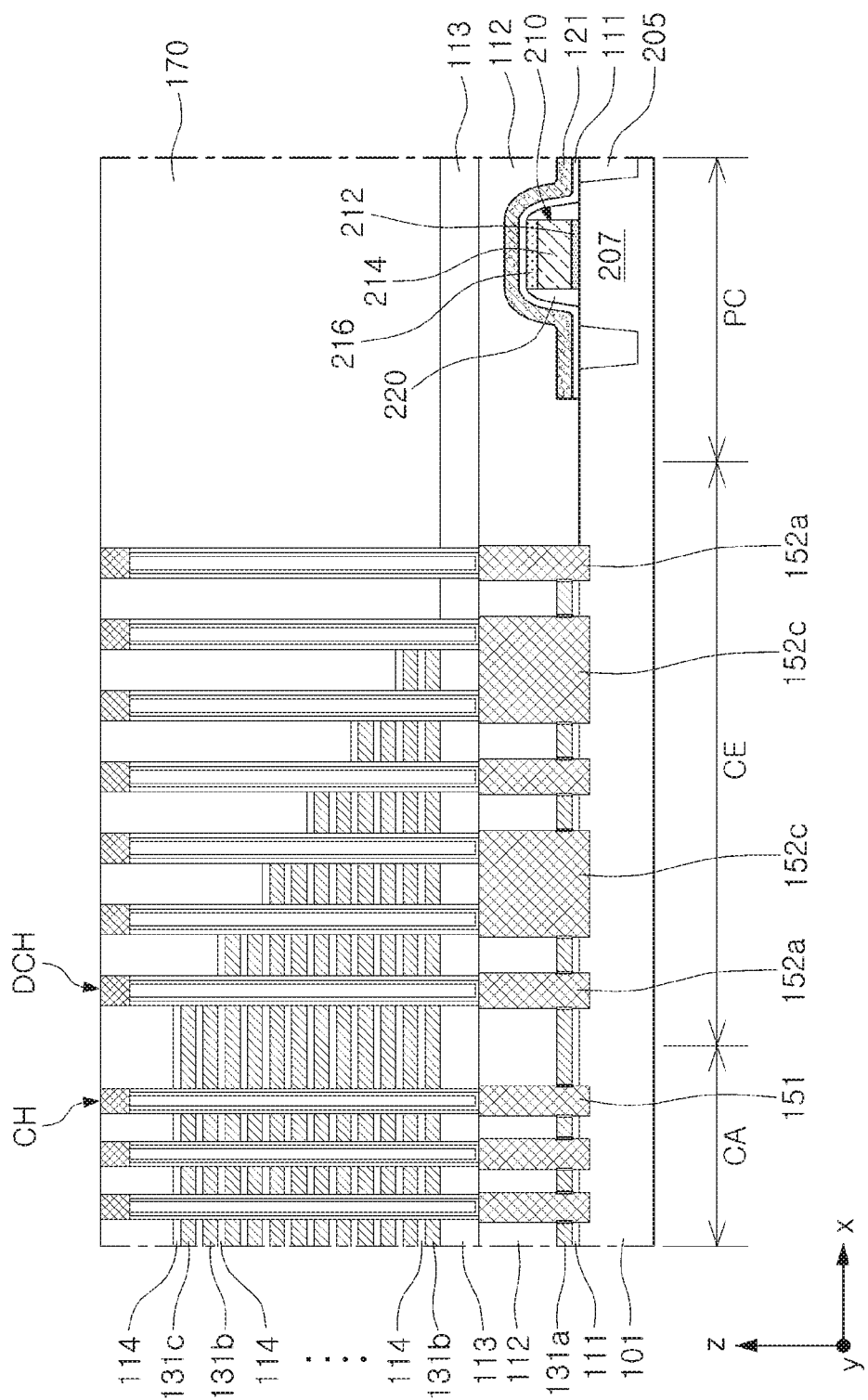

FIGS. 10 and 11 are schematic plan and cross-sectional views of a vertical memory device according to another example embodiment of the present disclosure, respectively.

The vertical memory device, illustrated in FIGS. 10 and 11, may differ from the vertical memory device, illustrated in FIGS. 8 and 9, in terms of shapes of second semiconductor patterns 152a and 152c.

In this example embodiment, the second semiconductor patterns 152a and 152c may include first patterns 152a, having a bar shape extending in the first direction, for example, the y-axis direction, and second patterns 152c having a bar shape extending in the second direction, for example, the x-axis direction. The first and second patterns 152a and 152c may be alternately disposed in the second direction, for example, the x-axis direction. A disposition of the first and second patterns 152a and 152c, illustrated in FIGS. 10 and 11, is an example, and may be modified in various manners. The first patterns 152a may commonly contact two dummy channel structures DCHs disposed adjacent to each other in the first direction, for example, the y-axis direction, and the second patterns 152c may commonly contact two dummy channel structures DCHs disposed adjacent to each other in the second direction, for example, the x-axis direction.

FIGS. 12, 13, 14, 15, 16, 17, 18, 19, and 20 are cross-sectional views illustrating a method of manufacturing a vertical memory device according to an example embodiment of the present disclosure. The method of manufacturing the vertical memory device, illustrated in FIGS. 1 through 4, will hereinafter be described with reference to FIGS. 12 through 20.

Figure 12:
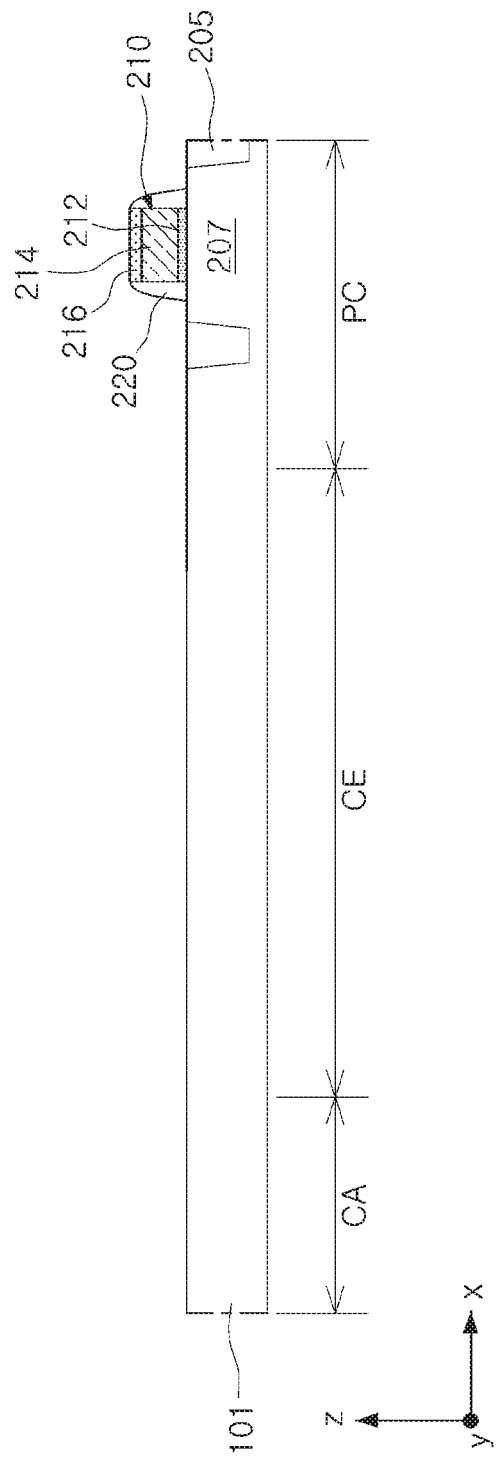
FIGS. 12, 13, 14, 15, 16, 17, 18, 19, and 20 are cross-sectional views illustrating a method of manufacturing a vertical memory device according to an example embodiment of the present disclosure.

Referring to FIG. 12, the substrate 101 may include the cell array region CA, the connection region CE, and the peripheral circuit region PC. The circuit transistor 210, forming a peripheral circuit, may be disposed in the peripheral circuit region PC. The circuit transistor 210 may include the active region 207, the circuit gate dielectric layer 212, and the circuit gate electrode 214.

A device separator 205 and the active region 207 defined thereby may be formed in the peripheral circuit region PC. The circuit gate dielectric layer 212 and the circuit gate electrode 214 may be disposed in the active region 207. The capping layer 216 may be formed on the circuit gate electrode 214, and the spacer 220 may be formed on the lateral surface of the circuit gate electrode 214.

Figure 13:
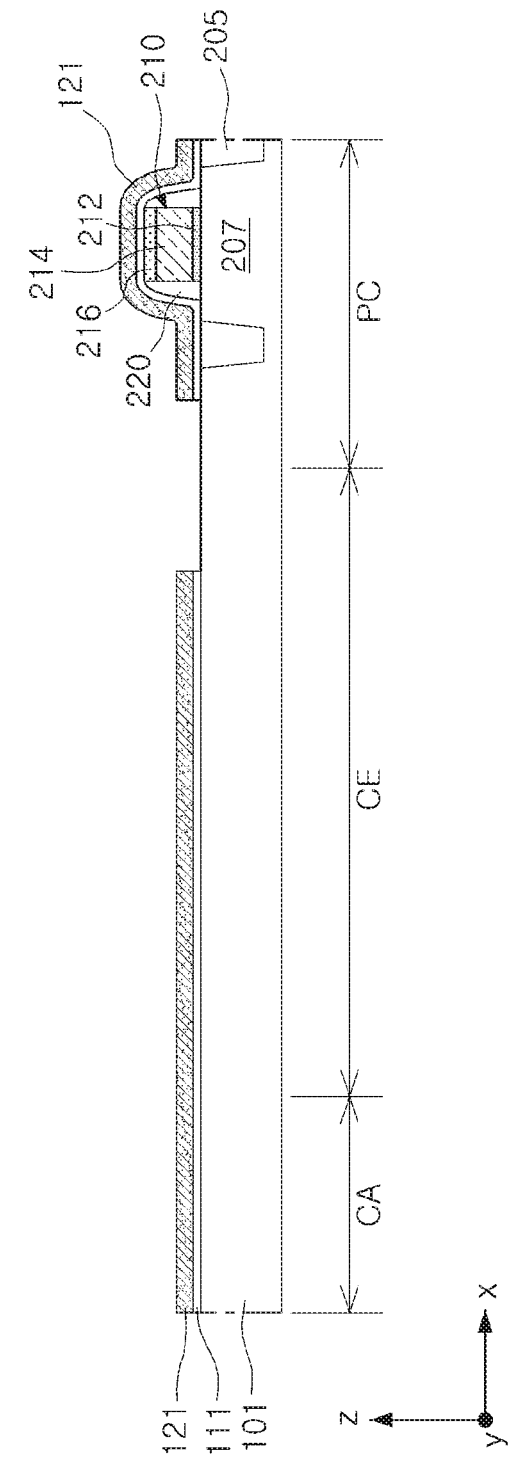

Referring to FIG. 13, the buffer insulating layer 111 and the sacrificial layer 121 may be formed on the substrate 101. The buffer insulating layer 111 and the sacrificial layer 121 may be formed in the cell array region CA, the connection region CE, and the peripheral circuit region PC. A portion of the buffer insulating layer 111 and a portion of the sacrificial layer 121 between the connection region CE and the peripheral circuit region PC may be removed. The buffer insulating layer 111 and the sacrificial layer 121 may be conformally deposited on surfaces of the above structures, formed on the substrate 101, using a chemical vapor deposition (CVD) process. The buffer insulating layer 111 and the sacrificial layer 121, formed in the peripheral circuit region PC, may cover the circuit transistor 210. For example, the buffer insulating layer 111 may include a silicon oxide, and the sacrificial layer 121 may include a silicon nitride. The sacrificial layer 121, formed in the cell array region CA and the connection region CE, may be removed by a subsequent gate replacement process. The sacrificial layer 121, formed in the peripheral circuit region PC, may remain without being removed. The sacrificial layer 121, formed in the peripheral circuit region PC, may be an etch stop layer.

Figure 14:
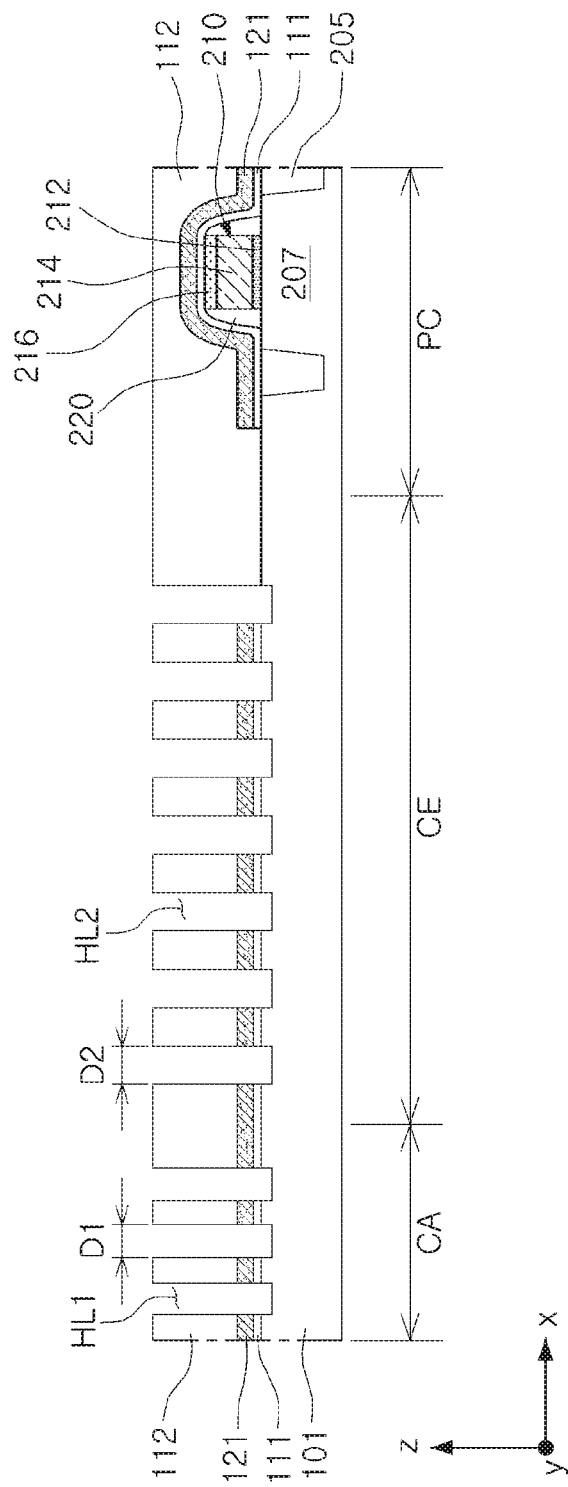

Referring to FIG. 14, the first interlayer insulating layer 112, including a first hole HL1 in the cell array region CA and a second hole HL2 in the connection region CE, may be formed.

The first and second holes HL1 and HL2 may extend to the substrate 101 through the first interlayer insulating layer 112, the buffer insulating layer 111, and the sacrificial layer 121. Recess regions may be formed in upper portions of the substrate 101 exposed by the first and second holes HL1 and HL2. The first and second holes HL1 and HL2 may have cylindrical shapes. The first diameter D1 of the first hole HL1 may be smaller than the second diameter D2 of the second hole HL2.

The formation of the first interlayer insulating layer 112 may include forming an insulating layer on the substrate 101, and then performing a planarization process, for example, a chemical mechanical polishing (CMP) process. A height of the first interlayer insulating layer 112 may be adjusted, such that the sacrificial layer 121 disposed in the peripheral circuit region PC may not be exposed. For example, the height of the first interlayer insulating layer 112 may be higher than the upper surface of the sacrificial layer 121 covering the circuit transistor 210 disposed in the peripheral circuit region PC. In an example embodiment, the height of the first interlayer insulating layer 112 may be adjusted, such that the sacrificial layer 121 disposed in the peripheral circuit region PC may be exposed.

The formation of the first and second holes HL1 and HL2 may include forming a mask pattern, for example, a photoresist pattern, on the first interlayer insulating layer 112 and continuously and anisotropically etching the first interlayer insulating layer 112, the sacrificial layer 121, and the buffer insulating layer 111 until the upper surface of the substrate 101 may be exposed, using the mask pattern as an etching mask. After the completion of the anisotropic etching, the mask pattern may be removed.

Figure 15:
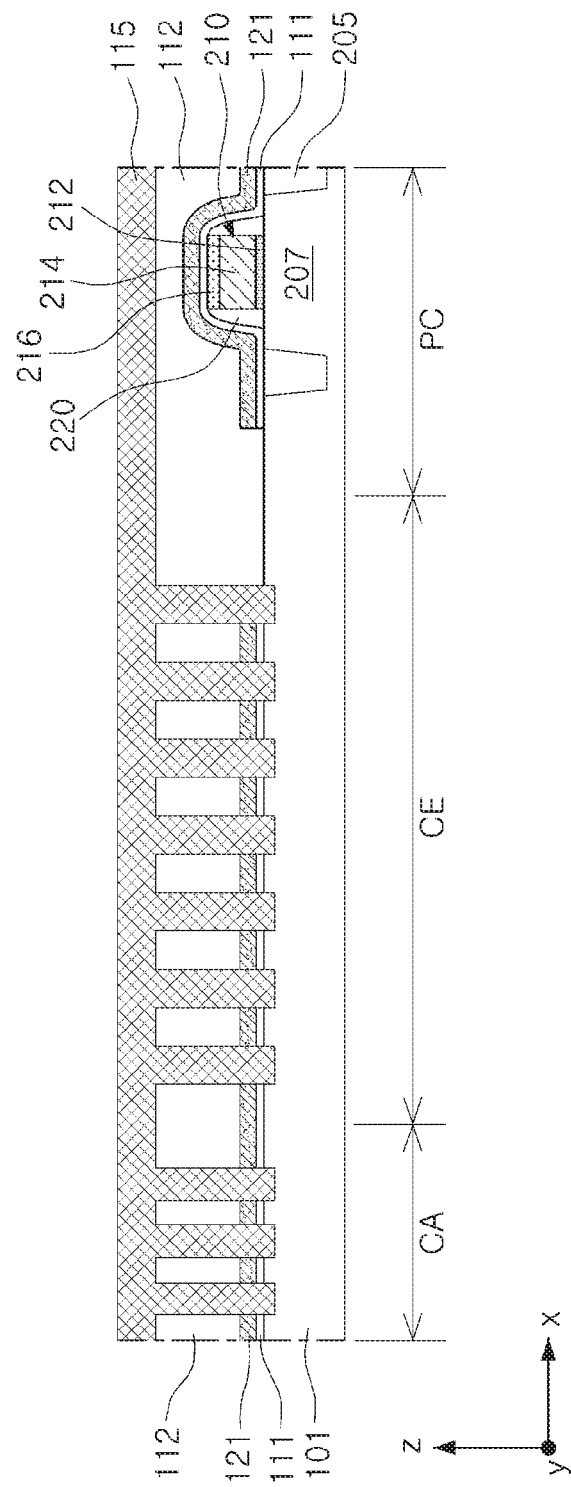

Referring to FIG. 15, a semiconductor material layer 115, filling the first and second holes HL1 and HL2, may be formed. The semiconductor material layer 115 may fully fill the first and second holes HL1 and HL2 using a CVD process. The semiconductor material layer 115 may also be formed on the first interlayer insulating layer 112. The semiconductor material layer 115 may include polycrystalline silicon or polycrystalline silicon-germanium. The semiconductor material layer 115 may further include impurity ions to be doped.

Referring to FIG. 16, the first semiconductor patterns 151 may be formed in the cell array region CA, and the second semiconductor patterns 152 may be formed in the connection region CE.

The formation of the first and second semiconductor patterns 151 and 152 may include removing the semiconductor material layer 115 that has covered the first interlayer insulating layer 112 using a planarization process, for example, a CMP process. The planarization process may cause the upper surface of the first interlayer insulating layer 112 to be exposed. The first height H1 of the first semiconductor patterns 151 may be substantially the same as the second height H2 of the second semiconductor patterns 152. The first and second heights H1 and H2 may be higher than the third height H3 of the sacrificial layer 121 covering the circuit transistor 210 disposed in the peripheral circuit region PC. The first to third heights H1 to H3 may be measured based on the upper surface of the substrate 101. The first diameter D1 of the first semiconductor patterns 151 may be smaller than the second diameter D2 of the second semiconductor patterns 152.

Referring to FIG. 17, the second interlayer insulating layer 113, and sacrificial layers 122 and the mold insulating layers 114, alternately stacked on the second interlayer insulating layer 113, may be formed.

The sacrificial layers 122 may be formed of a material having etch selectivity with respect to the mold insulating layers 114. For example, the mold insulating layers 114 may include at least one of a silicon oxide layer or a silicon nitride layer, and the sacrificial layers 122 may include at least one of a silicon layer, a silicon oxide layer, a silicon carbide layer or a silicon nitride layer, different from the mold insulating layers 114.

In an example embodiment, the sacrificial layers 122 may include a silicon nitride, and the mold insulating layers 114 may include a silicon oxide.

Figure 18:
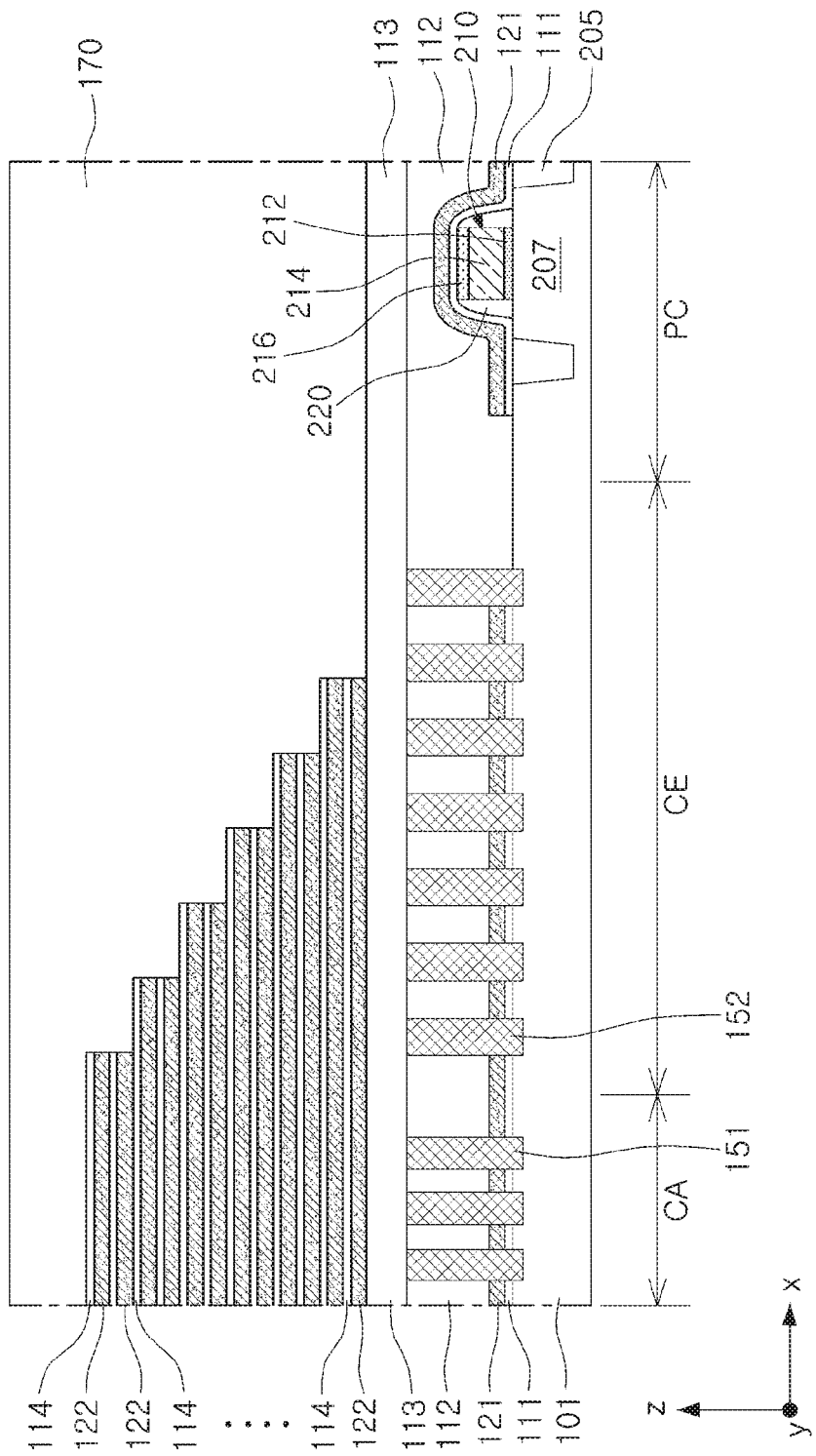

Referring to FIG. 18, the stepped structure may be formed by patterning the mold insulating layers 114 and the sacrificial layers 122 formed in the connection region CE. The stepped structure may be formed by patterning the mold insulating layers 114 and the sacrificial layers 122 multiple times. Each of the step layers ST, forming the stepped structure, may include two mold insulating layers 114 and two sacrificial layers 122. In an example embodiment, each of the step layers ST may include three or more mold insulating layers 114 and three or more sacrificial layers 122. Accordingly, in the connection region CE, horizontal lengths of the mold insulating layers 114 and the sacrificial layers 122, for example, lengths thereof in the x-axis direction, may be different from each other. The horizontal lengths of the mold insulating layers 114 and the sacrificial layers 122 may be reduced as a distance from the substrate 101 increases.

Subsequently, the third interlayer insulating layer 170 may be formed on the substrate 101. The third interlayer insulating layer 170 may have a sufficient thickness to cover the cell array region CA and the stepped structure formed in the connection region CE. The formation of the third interlayer insulating layer 170 may include a planarization process, for example, a CMP process.

Figure 19:
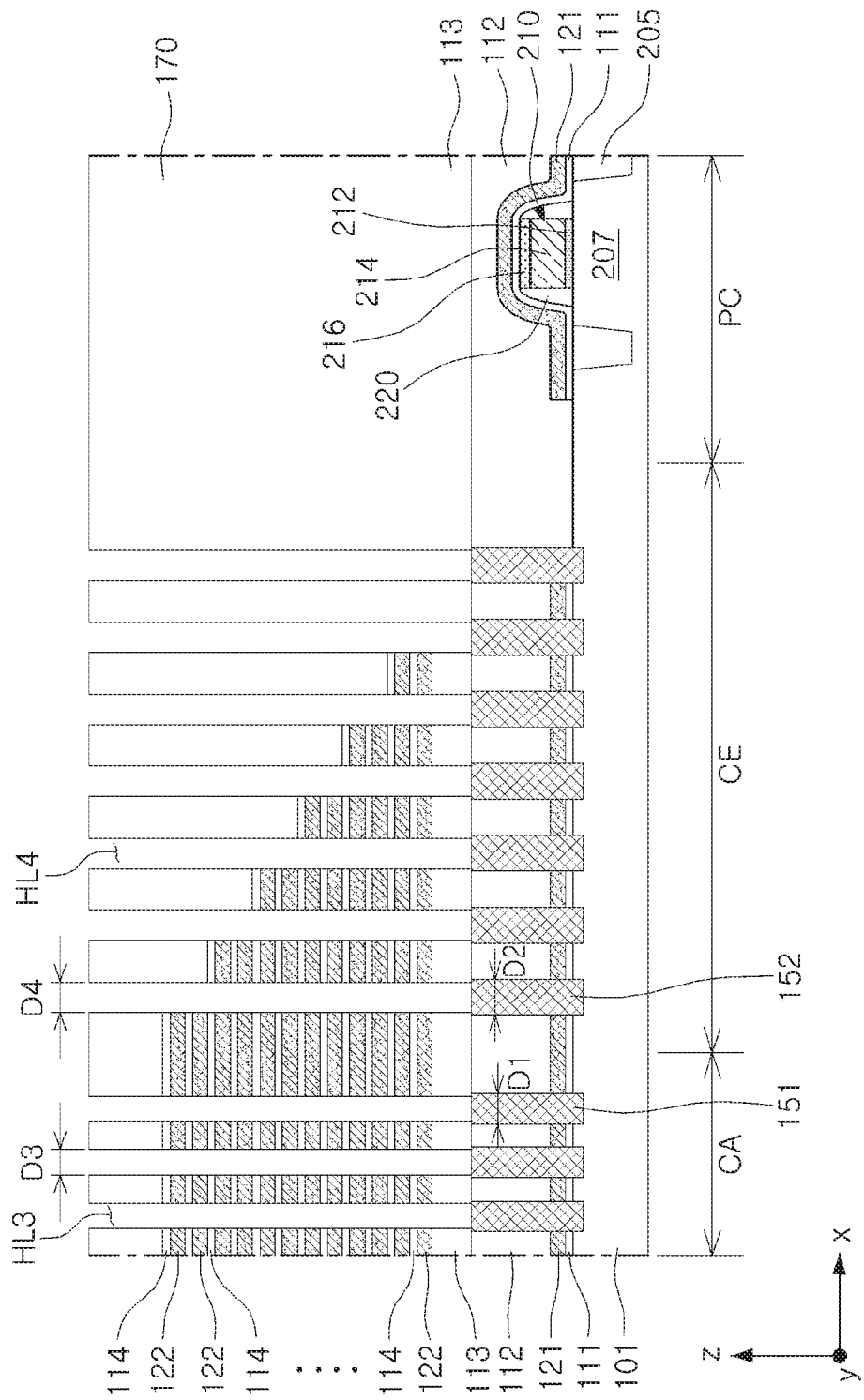

Referring to FIG. 19, the channel holes HL3 may be formed in the cell array region CA, and the dummy channel holes HL4 may be formed in the connection region CE.

The formation of the channel holes HL3 and the dummy channel holes HL4 may include forming the mask pattern on the third interlayer insulating layer 170 and continuously and anisotropically etching the third interlayer insulating layer 170, the mold insulating layers 114, the sacrificial layers 122, and the second interlayer insulating layer 113 until the upper surfaces of the first and second semiconductor patterns 151 and 152 may be exposed, using the mask pattern as an etching mask.

The channel holes HL3 and the dummy channel holes HL4 may have cylindrical hole shapes.

The third diameter D3 of the channel holes HL3 may be smaller than the fourth diameter D4 of the dummy channel holes HL4. The third diameter D3 of the channel holes HL3 may be smaller than the first diameter D1 of the first semiconductor patterns 151, and the fourth diameter D4 of the dummy channel holes HL4 may be smaller than the second diameter D2 of the second semiconductor patterns 152. In an example embodiment, the third diameter D3 of the channel holes HL3 may be the same as the first diameter D1 of the first semiconductor patterns 151, and the fourth diameter D4 of the dummy channel holes HL4 may be the same as the second diameter D2 of the second semiconductor patterns 152.

Figure 20:
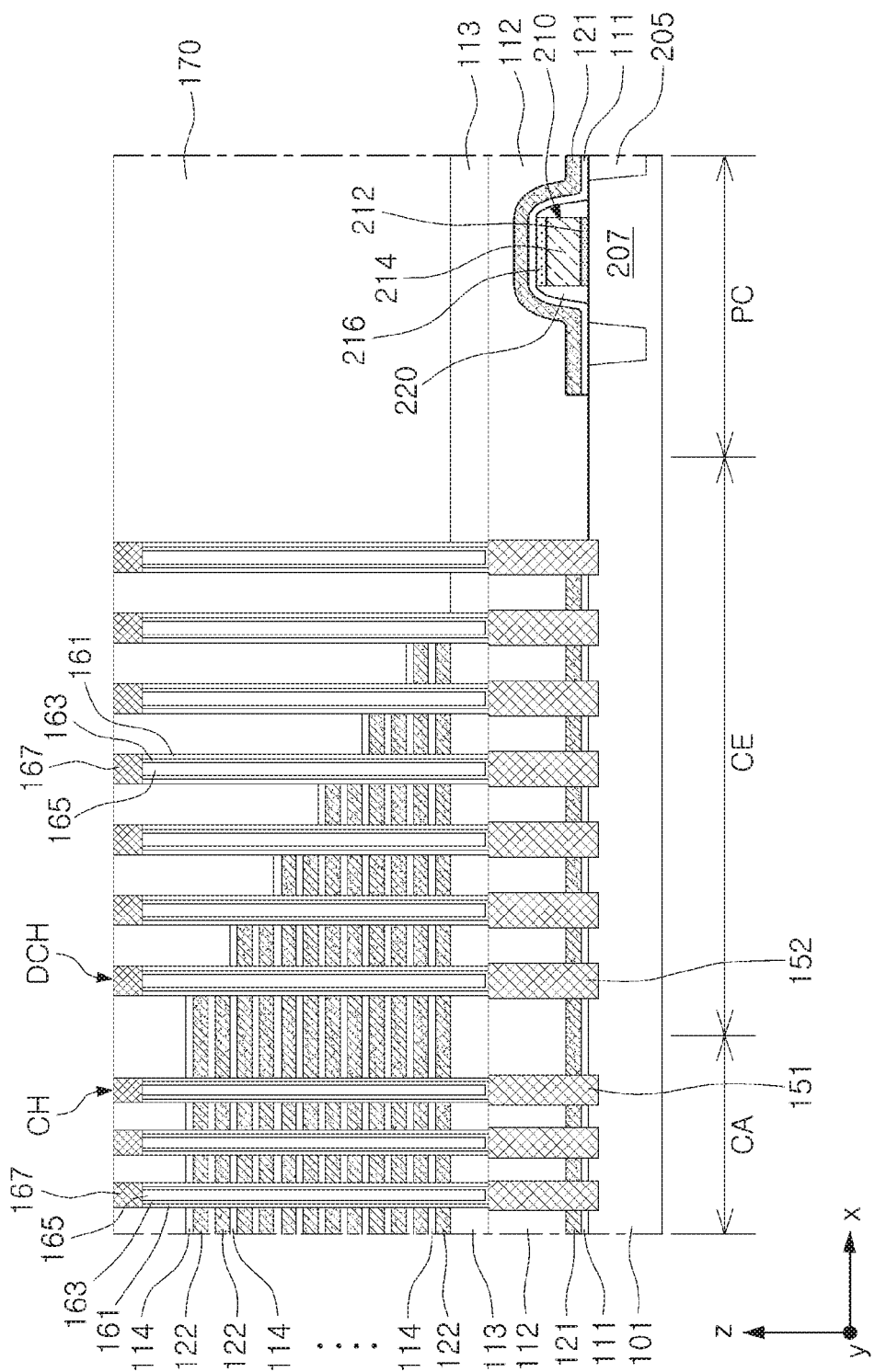

Referring to FIG. 20, the channel structures CHs may be formed in the channel holes HL3 formed on the first semiconductor patterns 151. Simultaneously, the dummy channel structures DCHs may be formed in the dummy channel holes HL4 formed on the second semiconductor patterns 152.

Each of the channel structures CHs may include the gate dielectric layer 161, the channel layer 163, and the filled insulating layer 165 sequentially stacked in the channel holes HL3. The channel structures CHs may contact the first semiconductor patterns 151 to be electrically connected to the substrate 101. Lower surfaces of the channel structures CHs may be disposed on a higher level than that of the upper surface of the sacrificial layer 121 covering the circuit transistor 210 disposed in the peripheral circuit region PC.

Due to being formed simultaneously with the channel structures CHs, the dummy channel structures DCHs may be similar or identical to the channel structures CHs.

The gate dielectric layers 161 may be formed in the channel holes HL3 and the dummy channel holes HL4 to have a pipe shape. The gate dielectric layer 161 may include a tunneling layer, a charge storage layer, and a blocking layer sequentially stacked from the channel layer 163.

The channel layer 163 may be formed on an interior of the gate dielectric layer 161. The channel layer 163 may have the pipe shape of which the lower end portion is closed. The channel layer 163 may include a semiconductor material such as amorphous silicon, polycrystalline silicon or monocrystalline silicon, and the semiconductor material may be a material undoped with an impurity, or a material including a p- or n-type impurity.

The internal space of the channel layer 163, defined thereby, may be filled by the filled insulating layer 165. The filled insulating layer 165 may be formed of an insulating material having excellent gap-fill characteristics.

The channel structures CHs and the dummy channel structures DCHs may further include the contact pad 167 formed on the channel layer 163 and the filled insulating layer 165, respectively. The contact pad 167 may be formed of polycrystalline silicon or a metal material doped with an impurity.

Returning to FIG. 2, the gate replacement process may allow the sacrificial layers 121 and 122 to be removed from the cell array region CA and the connection region CE and then fill the sacrificial layers 121 and 122 with conductive materials, thus forming the lowermost gate electrode layer 131a, the gate electrode layers 131b, and the uppermost gate electrode layer 131c. To perform the gate replacement process, trenches, in which the common source lines 180 of FIG. 1 are disposed, may first be formed.

Figure 21:
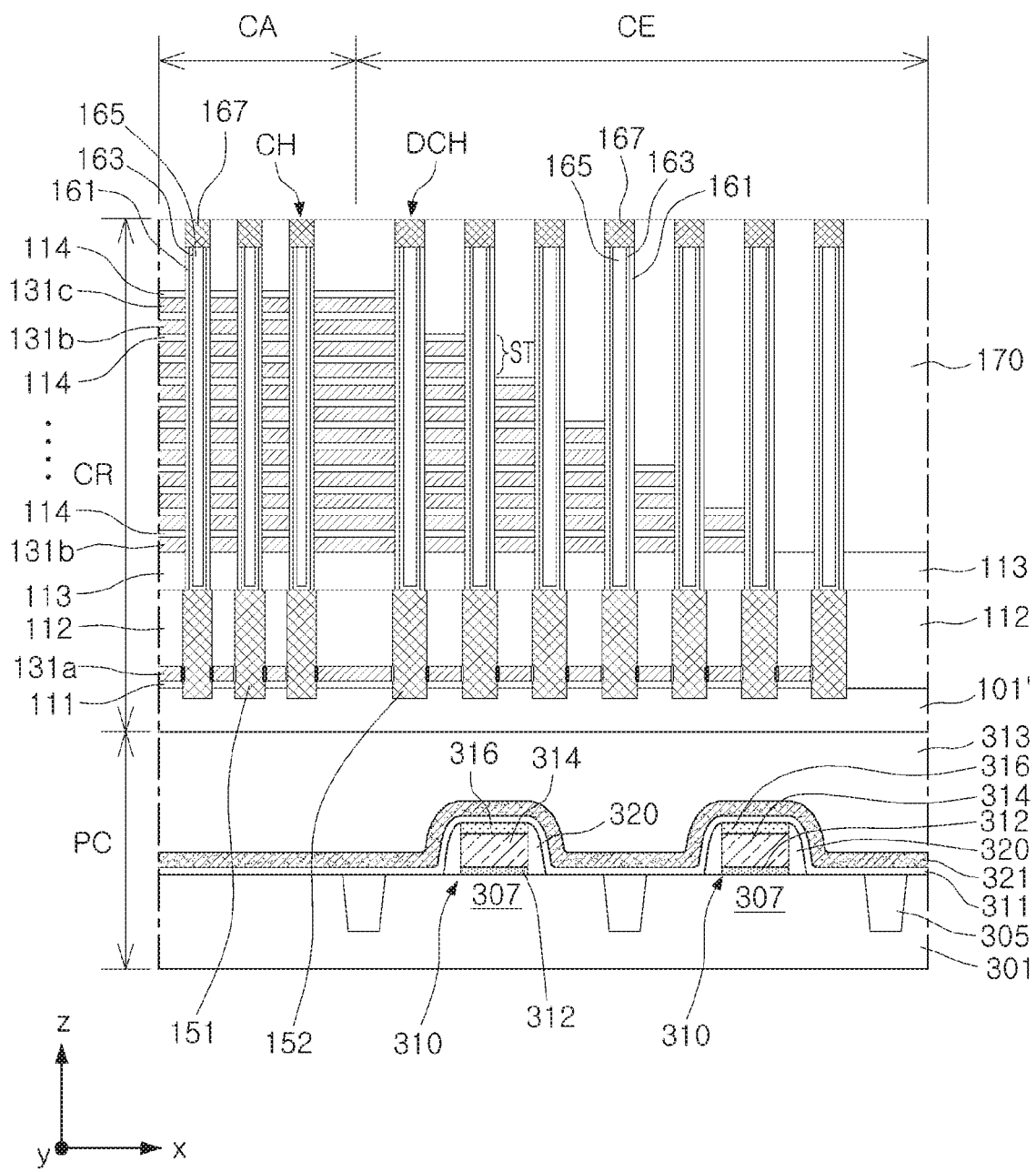
FIG. 21 is a schematic cross-sectional view of a vertical memory device according to another example embodiment of the present disclosure.

FIG. 21 is a schematic cross-sectional view of a vertical memory device according to another example embodiment of the present disclosure.

The vertical memory device, illustrated in FIG. 21, may have a structure in which a cell region CR is disposed on the peripheral circuit region PC. The cell region CR may include the cell array region CA and the connection region CE, and may have the same structure as the cell array region CA and the connection region CE. In an example embodiment, the cell region CR may also be disposed below the peripheral circuit region PC.

In this example embodiment, a substrate 101', in which the cell region CR is formed, may be formed of, for example, polycrystalline silicon or amorphous silicon, and then crystallized.

The peripheral circuit region PC may include a base substrate 301, circuit transistors 310 disposed on the base substrate 301, a buffer insulating layer 311, and an etch stop layer 321.

The base substrate 301 may include an active region 307 defined by a device separator 305. The base substrate 301 may include a semiconductor material, for example, a group IV semiconductor, a group III-V compound semiconductor, or a group II-VI compound semiconductor. For example, the group IV semiconductor may include silicon, germanium, or silicon-germanium. The base substrate 301 may also be provided as a bulk wafer or an epitaxial layer.

Each of the circuit transistors 310 may include a circuit gate dielectric layer 312 and a circuit gate electrode 314. A spacer 320 may be formed on a lateral surface of the circuit gate electrode 314, and a capping layer 316 may be formed on the circuit gate electrode 314. A source/drain region may be disposed on both sides of the circuit gate electrode 314 in the base substrate 301. An interlayer insulating layer 313 may be disposed on the base substrate 301 to cover the circuit transistors 310. Contact plugs and wiring lines, connected to the circuit transistors 310, may be disposed in the peripheral circuit region PC.

Figure 22:
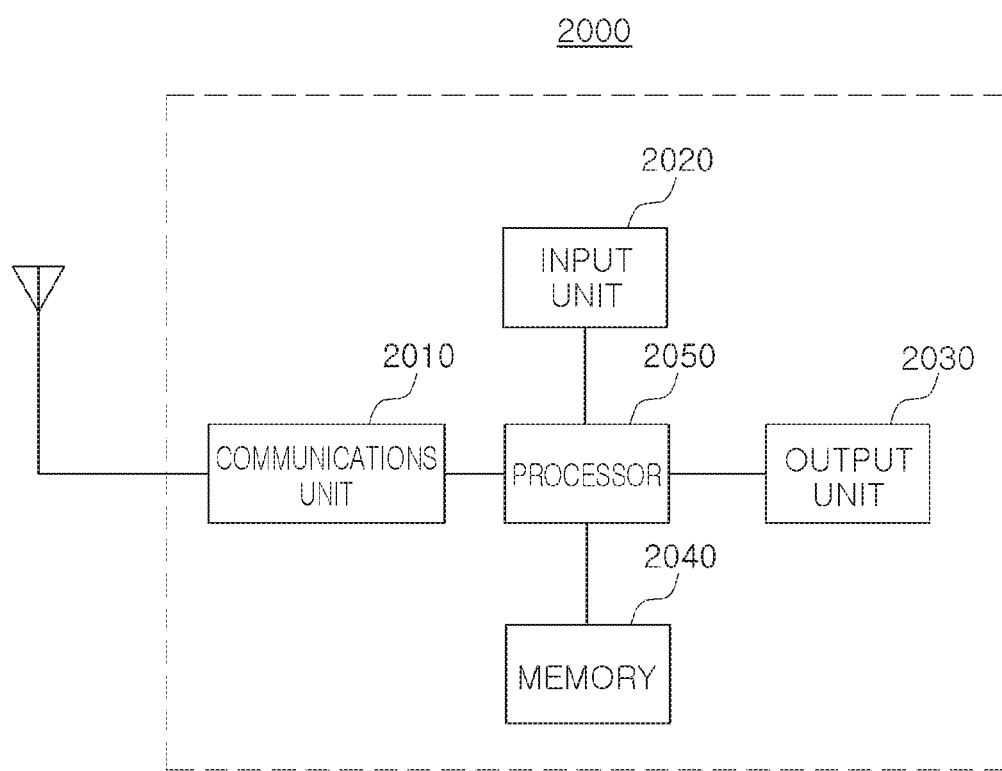
FIG. 22 is a block diagram of an electronic device including a vertical memory device according to an example embodiment of the present disclosure.

FIG. 22 is a block diagram of an electronic device including a vertical memory device according to an example embodiment of the present disclosure.

Referring to FIG. 22, an electronic device 2000 according to an example embodiment may include a communications unit 2010, an input unit 2020, an output unit 2030, a memory 2040, and a processor 2050.

The communication unit 2010 may include a wired/wireless communications module such as a wireless Internet module, a local communications module, a global positioning system (GPS) module, or a mobile communications module. The wired/wireless communications module, included in the communications unit 2010, may be connected to an external communications network, based on various communications standards, to transmit and receive data.

The input unit 2020 may include a mechanical switch, a touchscreen, a voice recognition module, and the like, as a module provided for a user to control operations of the electronic device 2000. In addition, the input unit 2020 may also include a mouse or a finger mouse device operating based on a trackball or a laser pointer, and may further include various sensor modules which enable a user to input data.

The output unit 2030 may output information processed by the electronic device 2000 in audio or video format, and the memory 2040 may store a program for processing or control of the processor 2050, or data. The memory 2040 may include a vertical memory device according to an example embodiment of the present disclosure as described above. The processor 2050 may send an instruction to the memory 2040 depending on a required operation to store data in or retrieve data from the memory 2040.

The memory 2040 may be embedded in the electronic device 2000, or may communicate with the processor 2050 through an additional interface. When the memory 2040 communicates with the processor 2050 through the additional interface, the processor 2050 may store data in or retrieve data from the memory 1040 through various interface standards such as secure digital (SD), secure digital high capacity (SDHC), secure digital extended capacity (SDXC), micro SD, universal serial bus (USB), etc.

The processor 2050 may control operations of each component included in the electronic device 2000. The processor 2050 may perform control and processing associated with a voice call, a video call, data communications, and the like, or may conduct control and processing for multimedia reproduction and management. The processor 2050 may also process an input entered by a user through the input unit 2020 and output a result thereof through the output unit 2030. Furthermore, the processor 2050 may store or retrieve data required to control operations of the electronic device 2000 to/from the memory 2040 as described above.

As set forth above, according to example embodiments of the present disclosure, a vertical memory device having improved reliability may be provided by disposing polycrystalline semiconductor patterns, formed by a planarization process, below channel structures and dummy channel structures.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While exemplary embodiments have been shown and described above, it will be apparent to those skilled in the art that modifications and variations could be made without departing from the scope of the present disclosure, as defined by the appended claims.

What is claimed is:

1. A vertical memory device comprising:
   a substrate having a cell array region and a connection region positioned on an exterior of the cell array region;
   a plurality of gate electrode layers stacked on the cell array region and the connection region of the substrate, forming a stepped structure in the connection region;
   a plurality of channel structures disposed in the cell array region, extending in a direction perpendicular to an upper surface of the substrate, while passing through the gate electrode layers; and
   a plurality of first semiconductor patterns disposed below the channel structures,
   a first interlayer insulating layer and a second interlayer insulating layer disposed between a first gate electrode layer and a second gate electrode layer nearest to the first gate electrode layer among the gate electrode layers, wherein:
   the first semiconductor patterns pass through the first interlayer insulating layer,
   the channel structures pass through the second interlayer insulating layer,
   the first and second interlayer insulating layers are between an upper surface of the first gate electrode layer and a lower surface of the second gate electrode layer,
   a width of each of the first semiconductor patterns is greater than a width of a channel layer of each of the channel structures adjacent to the first semiconductor patterns, and
   upper surfaces of the first semiconductor patterns are coplanar with an upper surface of the first interlayer insulating layer.

2. The vertical memory device of claim 1, wherein the first gate electrode layer is a lowermost gate electrode layer among the gate electrode layers.

3. The vertical memory device of claim 1, further comprising:
   a plurality of dummy channel structures disposed in the connection region, extending in the same direction as the channel structures; and
   a plurality of second semiconductor patterns disposed below the dummy channel structures, wherein
   the upper surfaces of the first semiconductor patterns and upper surfaces of the second semiconductor patterns are coplanar with the upper surface of the first interlayer insulating layer.

4. The vertical memory device of claim 1, further comprising:
   an interface insulating layer disposed between the first interlayer insulating layer and the second interlayer insulating layer, wherein
   the channel structures pass through the interface insulating layer.

5. The vertical memory device of claim 1, further comprising:
   a plurality of dummy channel structures disposed in the connection region, extending in the same direction as the channel structures; and a plurality of second semiconductor patterns disposed below the dummy channel structures, wherein the first semiconductor patterns and the second semiconductor patterns have different shapes.

6. The vertical memory device of claim 1, further comprising:

a plurality of dummy channel structures disposed in the connection region, extending in the same direction as the channel structures; and a plurality of second semiconductor patterns disposed below the dummy channel structures, wherein each of the second semiconductor patterns has a bar shape extending in a first direction, and is commonly connected to at least two dummy channel structures.

7. The vertical memory device of claim 1, further comprising:

a plurality of dummy channel structures disposed in the connection region, extending in the same direction as the channel structures; and a plurality of second semiconductor patterns disposed below the dummy channel structures, wherein the second semiconductor patterns include first patterns having a bar shape extending in a first direction and second patterns having a bar shape extending in a second direction different from the first direction, and the first patterns and the second patterns are commonly connected to at least two dummy channel structures, respectively.

8. The vertical memory device of claim 1, further comprising:

a plurality of dummy channel structures disposed in the connection region, extending in the same direction as the channel structures; and a plurality of second semiconductor patterns disposed below the dummy channel structures;

circuit transistors disposed in a peripheral circuit region of the substrate disposed on an exterior of the connection region; and an etch stop layer covering the circuit transistors in the peripheral circuit region, wherein upper surfaces of all the first semiconductor patterns and upper surfaces of all the second semiconductor patterns are higher than an upper surface of the etch stop layer.

9. The vertical memory device of claim 1, wherein first semiconductor patterns have a diameter or width greater than a diameter or width of the channel structures.

10. The vertical memory device of claim 1, further comprising:

a plurality of dummy channel structures disposed in the connection region, extending in the same direction as the channel structures; and a plurality of second semiconductor patterns disposed below the dummy channel structures, wherein sidewalls of the second semiconductor patterns and sidewalls of the dummy channel structures form stepped structures at a level at which the second semiconductor patterns and the dummy channel structures are in contact.

11. The vertical memory device of claim 10, wherein the second semiconductor patterns have a diameter or width greater than a diameter or width of the dummy channel structures.

12. The vertical memory device of claim 10, wherein all the first semiconductor patterns and all the second semiconductor patterns have substantially the same vertical height above the substrate.

13. A vertical memory device comprising:

a substrate having a cell array region, a peripheral circuit region, and a connection region positioned between the cell array region and the peripheral circuit region;

a first interlayer insulating layer and a second interlayer insulating layer on the first interlayer insulating layer;

a plurality of first semiconductor patterns disposed in the cell array region; and a plurality of channel structures extending in a direction perpendicular to an upper surface of the substrate, and contacting the plurality of first semiconductor patterns, each of the channel structures including a channel layer extending in the direction perpendicular to the upper surface of the substrate, wherein:

the first semiconductor patterns have a diameter or width greater than a diameter or width of the channel structures, the second interlayer insulating layer is in direct contact with the first interlayer insulating layer, and an upper surface of the first interlayer insulating layer is coplanar with upper surfaces of the first semiconductor patterns.

14. The vertical memory device of claim 13, further comprising:

a plurality of second semiconductor patterns disposed in the connection region;

a plurality of dummy channel structures extending in the direction perpendicular to the upper surface of the substrate, and contacting the second semiconductor patterns; and a circuit transistor disposed in the peripheral circuit region, wherein a height of the first semiconductor patterns and a height of the second semiconductor patterns are greater than a height of the circuit transistor.

15. The vertical memory device of claim 13, further comprising:

a plurality of second semiconductor patterns disposed in the connection region;

a plurality of dummy channel structures extending in the direction perpendicular to the upper surface of the substrate, and contacting the second semiconductor patterns; and a circuit transistor disposed in the peripheral circuit region, wherein:

the first interlayer insulating layer covers the circuit transistor and surrounds a portion of a sidewall of each of the second semiconductor patterns, and upper surfaces of the second semiconductor patterns are coplanar with the upper surface of the first interlayer insulating layer.

16. The vertical memory device of claim 15, wherein the channel structures and the dummy channel structures pass through the second interlayer insulating layer.

17. The vertical memory device of claim 15, further comprising:

a plurality of gate electrode layers vertically stacked on the cell array region and the connection region of the substrate, wherein a lowermost gate electrode layer among the gate electrode layers is covered by the first interlayer insulating layer, a remainder of the gate electrode layers is disposed on the second interlayer insulating layer, and the first semiconductor patterns and the second semiconductor patterns pass through the lowermost gate electrode layer.

18. A vertical memory device comprising:
a substrate having a cell array region and a connection region positioned adjacent to the cell array region;
a plurality of gate electrode layers vertically stacked on the cell array region and the connection region of the substrate;
a plurality of first semiconductor patterns vertically passing through a lowermost gate electrode layer among the gate electrode layers within the cell array region;
a plurality of channel structures disposed on the first semiconductor patterns, extending in a direction perpendicular to an upper surface of the substrate, while passing through a portion of the gate electrode layers; and
a first interlayer insulating layer and a second interlayer insulating layer vertically stacked between the lowermost gate electrode layer and a gate electrode layer nearest to the lowermost gate electrode layer, wherein
a level at which the first semiconductor patterns and the channel structures are in contact is a same as a level at which the first interlayer insulating layer and the second interlayer insulating layer are in contact.

19. The vertical memory device of claim 18, further comprising:
a plurality of second semiconductor patterns vertically passing through the lowermost gate electrode layer within the connection region; and
a plurality of dummy channel structures disposed on the second semiconductor patterns, extending in the same direction as the channel structures, while passing through a portion of the gate electrode layers forming a stepped structure, wherein:
the first semiconductor patterns have a diameter or width greater than a diameter or width of the channel structures, and
the second semiconductor patterns have a diameter or width greater than a diameter or width of the dummy channel structures.

20. The vertical memory device of claim 18, further comprising:
a plurality of second semiconductor patterns vertically passing through the lowermost gate electrode layer within the connection region; and
a plurality of dummy channel structures disposed on the second semiconductor patterns, extending in the same direction as the channel structures, wherein
upper surfaces of the first semiconductor patterns and upper surfaces of the second semiconductor patterns are substantially coplanar with an upper surface of the first interlayer insulating layer.

* * * * *